United States Patent
Jang et al.

(10) Patent No.: US 9,070,838 B2
(45) Date of Patent: Jun. 30, 2015

(54) OPTOELECTRONIC DEVICE AND STACKING STRUCTURE

(75) Inventors: Eun Joo Jang, Suwon-si (KR); Shin Ae Jun, Seongnam-si (KR); Hyun A Kang, Suwon-si (KR); Hyo Sook Jang, Yongin-si (KR); Soo-Kyung Kwon, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 374 days.

(21) Appl. No.: 13/351,966

(22) Filed: Jan. 17, 2012

(65) Prior Publication Data

US 2012/0313082 A1 Dec. 13, 2012

(30) Foreign Application Priority Data

Jun. 10, 2011 (KR) .................. 10-2011-0056483

(51) Int. Cl.
*H01L 33/44* (2010.01)
*H01L 33/52* (2010.01)
*H01L 33/56* (2010.01)
*H01L 33/50* (2010.01)

(52) U.S. Cl.
CPC ............ *H01L 33/44* (2013.01); *Y10T 428/254* (2015.01); *H01L 33/501* (2013.01); *H01L 33/56* (2013.01)

(58) Field of Classification Search
None
See application file for complete search history.

(56) References Cited

U.S. PATENT DOCUMENTS

| | | | |
|---|---|---|---|
| 6,503,634 B1 | 1/2003 | Utz et al. | |
| 6,818,721 B2 * | 11/2004 | Zha et al. | 528/12 |
| 7,307,119 B2 | 12/2007 | Kim et al. | |
| 7,393,469 B2 * | 7/2008 | Benrashid et al. | 252/301.36 |
| 7,692,373 B2 * | 4/2010 | Bawendi et al. | 313/503 |
| 7,777,356 B2 | 8/2010 | Katayama et al. | |
| 7,910,940 B2 * | 3/2011 | Koike et al. | 257/98 |
| 2005/0022697 A1 * | 2/2005 | Benrashid et al. | 106/287.13 |
| 2007/0185261 A1 | 8/2007 | Lee et al. | |
| 2008/0152933 A1 * | 6/2008 | Mizuno et al. | 428/480 |
| 2008/0173886 A1 * | 7/2008 | Cheon et al. | 257/98 |
| 2009/0065792 A1 * | 3/2009 | Thompson et al. | 257/98 |
| 2009/0159914 A1 | 6/2009 | Zhan | |
| 2009/0206301 A1 | 8/2009 | Verschuuren et al. | |
| 2009/0253805 A1 * | 10/2009 | Hoyle et al. | 514/772.3 |
| 2010/0025724 A1 | 2/2010 | Bae et al. | |

(Continued)

FOREIGN PATENT DOCUMENTS

| | | |
|---|---|---|
| EP | 0874278 A1 | 10/1998 |
| EP | 2157624 A1 | 2/2010 |

(Continued)

OTHER PUBLICATIONS

Hoyle C. E., Lee, T.Y. and Roper, T. (2004), Thiol-enes: Chemistry of the past with promise for the future. J. Polym. Sci. A Polym. Chem., 42: 5301-533.*

(Continued)

*Primary Examiner* — Joseph Schoenholtz
(74) *Attorney, Agent, or Firm* — Cantor Colburn LLP

(57) ABSTRACT

Disclosed is an optoelectronic device that includes a light source, an emission layer disposed on the light source including a light emitting particle dispersed in a matrix polymer, and a polymer film disposed on the emission layer, the polymer film including a polymerized polymer of a first monomer including at least two thiol (—SH) groups and a second monomer including at least two carbon-carbon unsaturated bond-containing groups at a terminal end.

21 Claims, 5 Drawing Sheets

(56) References Cited

U.S. PATENT DOCUMENTS

| | | | |
|---|---|---|---|
| 2010/0068421 A1 | 3/2010 | Tse et al. | |
| 2010/0109025 A1* | 5/2010 | Bhat | 257/88 |
| 2010/0160475 A1 | 6/2010 | Stizmann et al. | |
| 2010/0184346 A1 | 7/2010 | Qi et al. | |
| 2010/0234527 A1 | 9/2010 | Ota et al. | |
| 2011/0012141 A1* | 1/2011 | Le Toquin et al. | 257/89 |
| 2011/0068362 A1* | 3/2011 | Negley et al. | 257/99 |

FOREIGN PATENT DOCUMENTS

| | | |
|---|---|---|
| JP | 2002-046210 A | 2/2002 |
| JP | 2006-213671 A | 8/2006 |
| JP | 2006-213760 A | 8/2006 |
| KR | 10-0503828 B1 | 7/2005 |
| KR | 1020070076832 A | 7/2007 |
| KR | 1020090009841 A | 1/2009 |
| KR | 1020090067026 A | 6/2009 |
| KR | 10-0980270 B1 | 8/2010 |

OTHER PUBLICATIONS

M. Konishi, T. Isobe, M. Senna, Enhancement of photoluminescence of ZnS:Mn nanocrystals by hybridizing with polymerized acrylic acid, Journal of Luminescence, vol. 93, Issue 1, May 2001, pp. 1-8.*
Hoyle C. E., Lee, T. Y. and Roper, T. (2004), Thiol—enes: Chemistry of the past with promise for the future. J. Polym. Sci. A Polym. Chem., 42: 5301-533.*

* cited by examiner

OPTOELECTRONIC DEVICE AND STACKING STRUCTURE

CROSS-REFERENCE TO RELATED APPLICATION

This application claims priority to Korean Patent Application No. 10-2011-0056483, filed on Jun. 10, 2011, and all the benefits accruing therefrom under 35 U.S.C. §119, the content of which in its entirety is herein incorporated by reference.

BACKGROUND

1. Field

This disclosure relates an optoelectronic device and a stacking structure.

2. Description of the Related Art

Semiconductor nanocrystals, which are also called quantum dots, are a semiconductor material with a nano-sized and crystalline structure, and include hundreds to thousands of atoms.

Since the semiconductor nanocrystals are very small, they have a large surface area per unit volume, and also have a quantum confinement effect. Accordingly, they have unique physicochemical properties that differ from the inherent characteristics of a corresponding bulk semiconductor material.

In particular, since optoelectronic properties of nanocrystals may be controlled by adjusting the size of the nanocrystals, the semiconductor nanocrystals are the subject of active research, and are being utilized in display devices and a variety of biotechnology applications.

When the semiconductor nanocrystal is used in a display element or the like, a silicon polymer may be used as a matrix resin for dispersing the semiconductor nanocrystal. However, the silicon polymer may not sufficiently protect the semiconductor nanocrystal due to its low oxygen and moisture barrier properties.

SUMMARY

An embodiment of this disclosure provides an optoelectronic device including a polymer film for improving the efficiency or the life-span of the optoelectronic device due to the excellent oxygen or moisture barrier properties.

Another embodiment of this disclosure provides a stacking structure including a polymer film for improving the efficiency or the life-span of the stacking structure due to the excellent oxygen and moisture barrier properties.

According to an embodiment of this disclosure, provided is an optoelectronic device that includes a light source; an emission layer disposed on the light source and including a light emitting particle dispersed in a matrix polymer; and a polymer film disposed on the emission layer. The polymer film may include a polymerized product of a first monomer including at least two thiol (—SH) groups and a second monomer including at least two carbon-carbon unsaturated bond-containing groups at least two terminal ends.

According to another embodiment of this disclosure, provided is a stacking structure that includes a composite layer including a matrix polymer and a light emitting particle dispersed in the matrix polymer, and a polymer film disposed on the composite layer. The polymer film may include a polymerized product of a first monomer including at least two thiol (—SH) groups and a second monomer including at least two carbon-carbon unsaturated bond-containing groups at a terminal end.

The first monomer including at least two thiol (—SH) groups may be represented by the following Chemical Formula 1.

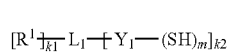

Chemical Formula 1

In Chemical Formula 1, $R^1$ is hydrogen, a substituted or unsubstituted linear or branched C1 to C30 alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a substituted or unsubstituted C2 to C30 alkenyl group, a substituted or unsubstituted C2 to C30 alkynyl group, a substituted or unsubstituted C3 to C30 alicyclic organic group including a double bond or triple bond in a ring, a substituted or unsubstituted C3 to C30 heterocycloalkyl group including a double bond or triple bond in a ring, a C3 to C30 alicyclic organic group substituted with a C2 to C30 alkenyl group or a C2 to C30 alkynyl group, a C3 to C30 heterocycloalkyl group substituted with a C2 to C30 alkenyl group or a C2 to C30 alkynyl group, a hydroxyl group, —NH$_2$, a substituted or unsubstituted C1 to C60 amine group (—NRR', wherein R and R' are each independently a linear or branched C1 to C30 alkyl group), an isocyanurate group, a (meth)acrylate group, a halogen, —ROR' (wherein R is a substituted or unsubstituted C1 to C20 alkylene group and R' is hydrogen or a linear or branched C1 to C20 alkyl group), —C(═O)OR' (wherein R' is hydrogen or a linear or branched C1 to C20 alkyl group) —CN, or —C(═O)ONRR' (wherein R and R' are each independently hydrogen or a linear or branched C1 to C20 alkyl group);

$L_1$ is a single bond, a substituted or unsubstituted C1 to C30 alkylene group, a substituted or unsubstituted C6 to C30 arylene group, substituted or unsubstituted C3 to C30 heteroarylene group, a substituted or unsubstituted C3 to C30 cycloalkylene, or a substituted or unsubstituted C3 to C30 heterocycloalkylene;

$Y_1$ is a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene group is replaced by a sulfonyl group (—S(═O)$_2$—), a carbonyl group (—C(═O)—), an ether group (—O—), a sulfide group (—S—), a sulfoxide group (—S(═O)—), an ester group (—C(═O)O—), an amide group (—C(═O)NR—) (wherein R is hydrogen or a linear or branched C1 to C10 alkyl group), an —NR— (wherein R is hydrogen or a linear or branched C1 to C10 alkyl group), or a combination thereof;

m is an integer of 1 or more;

k1 is an integer of 0 or 1 or more;

k2 is an integer of 1 or more; and the sum of m and k2 is an integer of 3 or more; provided that m does not exceed the valence of $Y_1$; and provided that the sum of k1 and k2 does not exceed the valence of $L_1$.

The second monomer may be represented by the following Chemical Formula 2.

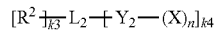

Chemical Formula 2

In Chemical Formula 2,

X is a C2 to C30 aliphatic organic group including a carbon-carbon unsaturated bond, a C6 to C30 aromatic organic group including a carbon-carbon double bond or a carbon-carbon triple bond, or a C3 to C30 alicyclic organic group including a carbon-carbon double bond or a carbon-carbon triple bond, $R^2$ is hydrogen, a substituted or unsubstituted linear or branched C1 to C30 alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a substituted or unsubstituted C2 to C30 alkenyl group, a substituted or unsubstituted C2 to C30 alkynyl group, a substituted or unsubstituted C3 to C30 alicyclic organic group including a double bond or triple bond in a ring, a substituted or unsubstituted C3 to C30 heterocycloalkyl group including a double bond or triple bond in a ring, a C3 to C30 alicyclic organic group substituted with a C2 to C30 alkenyl group or a C2 to C30 alkynyl group, a C3 to C30 heterocycloalkyl group substituted with a C2 to C30 alkenyl group or a C2 to C30 alkynyl group, a hydroxyl group, $-NH_2$, a substituted or unsubstituted C1 to C60 amine group (—NRR', wherein R and R' are each independently a linear or branched C1 to C30 alkyl group), an isocyanate group, an isocyanurate group, (meth)acryloyloxy group, a halogen, —ROR' (wherein R is a substituted or unsubstituted C1 to C20 alkylene group and R' is hydrogen or a linear or branched C1 to C20 alkyl group), an acyl halide group (—RC(=O)X, wherein R is a substituted or unsubstituted alkylene group and X is a halogen), —C(=O)OR' (wherein R' is hydrogen or a linear or branched C1 to C20 alkyl group), —CN, or —C(=O)ONRR' (wherein R and R' are each independently hydrogen or a linear or branched C1 to C20 alkyl group);

$L_2$ is a single bond, a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group;

$Y_2$ is a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene group is replaced by a sulfonyl group ($-S(=O)_2-$), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a linear or branched C1 to C10 alkyl group), —NR— (wherein R is hydrogen or a linear or branched C1 to C10 alkyl group), or a combination thereof;

n is an integer of 1 or more;

k3 is an integer of 0 or 1 or more;

k4 is an integer of 1 or more; and the sum of n and k4 is an integer of 3 or more; provided that n does not exceed the valence of $Y_2$; and provided that the sum of k3 and k4 does not exceed the valence of $L_2$.

The first monomer of the above Chemical Formula 1 may include a monomer of the following Chemical Formula 1-1.

Chemical Formula 1-1

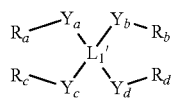

In Chemical Formula 1-1, $L_1'$ is a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group; and $Y_a$ to $Y_d$ are each independently substituted or unsubstituted C1 to C30 alkylene group, a substituted or unsubstituted C2 to C30 alkenylene group, or a C1 to C30 alkylene group or a C2 to C30 alkenylene group wherein at least one methylene group is replaced by a sulfonyl group ($-S(=O)_2-$), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a linear or branched C1 to C10 alkyl group), or —NR— (wherein R is hydrogen or a linear or branched C1 to C10 alkyl group.); and $R_a$ to $R_d$ are each independently a thiol group (SH) or one or more of the groups $-R_a-Y_a-$, $-R_b-Y_b-$, $R_c-Y_c-$, and $R_d-Y_d-$ are $R_1$ of Chemical Formula 1, provided that at least two of $Y_a$ to $Y_d$ are as defined above and at least two of $R_a$ to $R_d$ are thiol groups (SH).

In the above Chemical Formula 2, X may be an acryloxy group, a methacryloxy group, a substituted or unsubstituted C2 to C30 alkenyl group, a substituted or unsubstituted C2 to C30 alkynyl group, a substituted or unsubstituted C3 to C30 alicyclic organic group including a double bond or triple bond in a ring, a substituted or unsubstituted C3 to C30 heterocycloalkyl group including a double bond or triple bond in a ring, a C3 to C30 alicyclic organic group substituted with a C2 to C30 alkenyl group or a C2 to C30 alkynyl group, or a C3 to C30 heterocycloalkyl group substituted with a C2 to C30 alkenyl group or a C2 to C30 alkynyl group.

In the above Chemical Formula 2, the X group may be a norbornene group, a maleimide group, a nadimide group, a tetrahydrophthalimide group, or a combination thereof.

In Chemical Formula 2, $L_2$ may be a substituted or unsubstituted pyrrolidinyl group, a substituted or unsubstituted tetrahydrofuranyl group, a substituted or unsubstituted pyridyl group, a substituted or unsubstituted pyrimidyl group, a substituted or unsubstituted piperidyl group, a substituted or unsubstituted triazinyl group, a substituted or unsubstituted trioxotriazinyl group, or a substituted or unsubstituted isocyanurate group.

The second monomer of the above Chemical Formula 2 may include the compounds represented by the following Chemical Formulae 2-1 and 2-2.

Chemical Formula 2-1

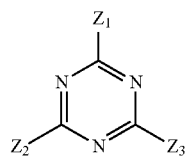

Chemical Formula 2-2

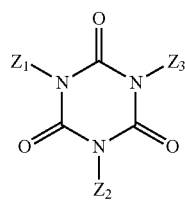

In Chemical Formulae 2-1 and 2-2, $Z_1$ to $Z_3$ are each independently *—$Y_2$—$X_n$ of the above Chemical Formula 2, wherein * represents the point of attachment to $L_2$.

The thiol group of the first monomer and the unsaturated carbon-carbon bond of the X group of the second monomer may be present at a mole ratio of about 1:0.75 to about 1:1.25.

The polymerized product may further comprise an additional polymerized product further comprising a third monomer having one thiol group located at a terminal end of the third monomer, a fourth monomer having one unsaturated carbon-carbon bond located at a terminal end of the fourth monomer, or a combination thereof.

The optoelectronic device may further include an additional polymer film including an organic/inorganic hybrid polymer disposed between the emission layer and the polymer film.

The stacking structure may further include an additional polymer film including an organic/inorganic hybrid polymer disposed between the composite layer and the polymer film.

The organic/inorganic hybrid polymer may include a first moiety including a siloxane bond (—Si—O—Si—), a second moiety including a siloxane bond and at least one functional group, and a third moiety including a siloxane bond and a cross-linked structure of at least one reactive functional group.

The organic/inorganic hybrid polymer may further include a fourth moiety including a —O-M-O— bond (wherein, M is Al, Sn, Ti, Zr, Ge, B, or a combination thereof).

The organic/inorganic hybrid polymer may be a condensation polymerization polymer of a first alkoxy silane represented by the following Chemical Formula 3, a second alkoxy silane represented by the following Chemical Formula 4, and a third alkoxy silane represented by the following Chemical Formula 5.

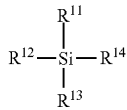

Chemical Formula 3

In Chemical Formula 3, $R^{11}$ to $R^{14}$ are each independently a hydroxyl group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group.

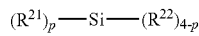

Chemical Formula 4

In Chemical Formula 4, $R^{21}$ is a substituted or unsubstituted C6 to C20 aryl group, a substituted or unsubstituted C1 to C20 linear or branched alkyl group, a substituted or unsubstituted C1 to C20 aminoalkyl group, a substituted or unsubstituted C2 to C20 alkynyl group, C2 to C20 alkenyl group, a substituted or unsubstituted C1 to C20 amine group, —C(=O)OR' (wherein R' is a C1 to C20 linear or branched alkyl group), or —C(=O)ONRR' (wherein R and R' are each independently a C1 to C20 linear or branched alkyl group);

$R^{22}$ is a hydroxyl group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group; and p is an integer ranging from 1 to 3.

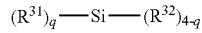

Chemical Formula 5

In Chemical Formula 5, $R^{31}$ is a reactive photo-cross-linking or a thermal cross-linking functional group, for example a (meth)acryloxy group, an epoxy group, a substituted or unsubstituted C2 to C30 alkenyl group, a substituted or unsubstituted C2 to C30 alkynyl group, a spiroorthoester group, a substituted or unsubstituted C3 to C30 alicyclic organic group including a double bond or triple bond in a ring, a substituted or unsubstituted C3 to C30 heterocycloalkyl group including a double bond or triple bond in a ring, a C3 to C30 alicyclic organic group substituted with a C2 to C30 alkenyl group or a C2 to C30 alkynyl group, and a C3 to C30 heterocycloalkyl group substituted with a C2 to C30 alkenyl group or a C2 to C30 alkynyl group;

$R^{32}$ is a hydroxyl group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group; and q is an integer ranging from 1 to 3.

The organic/inorganic hybrid polymer may be a condensation polymerization polymer of the alkoxy silane compounds represented by the above Chemical Formulae 3 to 5 and an alkoxide compound represented by the following Chemical Formula 6.

 Chemical Formula 6

In Chemical Formula 6,

R is a hydroxyl group, a halogen, a substituted or unsubstituted C1 to C8 linear or branched alkoxy group, for example, a methoxy, an ethoxy, an isopropoxy, or a t-butoxy, a substituted or unsubstituted C6 to C12 aryloxy group, a substituted or unsubstituted C2 to C10 carbonylalkyl group, or substituted or unsubstituted C2 to C10 carbonylalkoxy group;

M is Al, Si, Sn, Ti, Zr, Ge, B, or a combination thereof, and r is determined depending on a bonding valence of M.

The stacking structure may be applicable to a light emitting element such as a light emitting diode ("LED") device or an organic light emitting diode ("OLED"), a memory device, a laser device, or a solar cell.

The light emitting particle of the optoelectronic device or stacking structure may comprise a semiconductor nanocrystal which may be a Group II-VI compound, a Group III-V compound, a Group IV-VI compound, a Group IV element, a Group IV compound, or a combination thereof.

The light emitting particle may further include a coating including a polymer having a carboxyl group or a salt thereof.

The optoelectronic device may further include a transparent plate disposed between the light source and the emission layer to separate them.

BRIEF DESCRIPTION OF THE DRAWINGS

The above and other aspects, advantages and features of this disclosure will become more apparent by describing in further detail embodiments thereof with reference to the accompanying drawings, in which.

DETAILED DESCRIPTION

Figure 1:
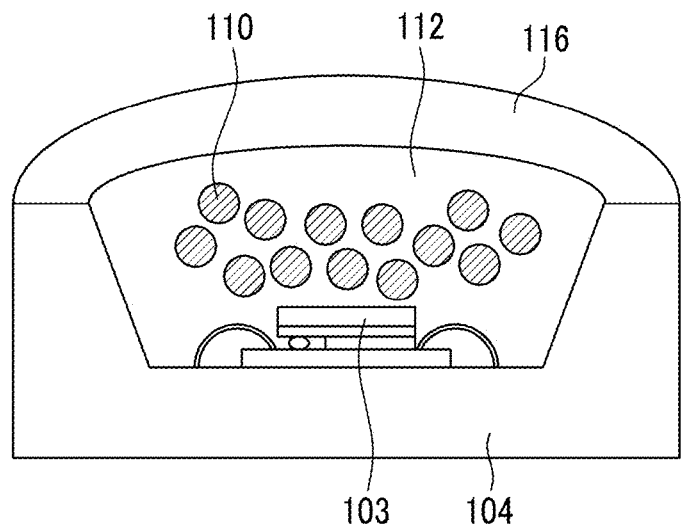
FIG. 1 is a cross-sectional view of a light emitting diode device according to an embodiment as disclosed herein.

This disclosure will be described more fully hereinafter with reference to the accompanying drawings, in which various embodiments are shown. This disclosure may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

The terminology used herein is for the purpose of describing particular embodiments only and is not intended to be limiting. As used here, the singular forms "a", "an" and "the" are intended to include the plural forms as well, unless the content clearly indicates otherwise. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning consistent with their meaning in the context of the relevant art and the present disclosure, and will not be interpreted in an idealized or overly formal sense unless expressly so defined herein.

An "alkyl" group is a saturated aliphatic hydrocarbyl group having the specified number of carbon atoms, a valence of one, and optionally substituted with one or more substituents where indicated.

An "alkenyl" group is a hydrocarbyl group having the specified number of carbon atoms, a valence of one, at least one carbon-carbon double bond, and optionally substituted with one or more substituents where indicated.

An "alkynyl" group is a hydrocarbon having the specified number of carbon atoms a valence of one, at least one carbon-carbon triple bond, and optionally substituted with one or more substituents where indicated.

A "cycloalkyl" group is a hydrocarbyl group having one or more saturated rings in which all ring members are carbon, the specified number of carbon atoms, a valence of one, and optionally substituted with one or more substituents where indicated. Non-limiting examples include cyclopropyl, cyclobutyl, cyclopentyl, cyclohexyl, cycloheptyl, cyclooctyl, and adamantly groups. A "cycloalkenyl" group is a cylcoalkyl group having at least one carbon-carbon double bond in the ring, and a "cycloalkynyl" group is a cycloalkyl group having at least one carbon-carbon triple bond in the ring. Cycloalkyl, cycloalkenyl, and cycloalkynyl groups do not contain an aromatic ring or a heterocyclic ring.

An "aryl" group is a carbocyclic ring system that includes one or more aromatic rings in which all ring members are carbon, having the specified number of carbon atoms, a valence of one, and optionally substituted with one or more substituents where indicated. More than one ring may be present, and any additional rings may be independently aromatic, saturated, or partially unsaturated and multiple rings, if present, may be fused, pendent, spirocyclic or a combination thereof. Non-limiting examples include phenyl, naphthyl, and tetrahydronaphthyl groups.

An "alkylene" group is an alkyl group having the specified number of carbon atoms, a valence of two or higher, and optionally substituted with one or more substituents where indicated.

An "alkenylene" group is an alkenyl group having the specified number of carbon atoms, a valence of two or higher, and optionally substituted with one or more substituents where indicated.

A "cycloalkylene" group is cycloalkyl group having one or more saturated rings in which all ring members are carbon, the specified number of carbon atoms, a valence of two or higher, and optionally substituted with one or more substituents where indicated.

An "arylene" group is an aryl group having the specified number of carbon atoms, and a valence of two or higher wherein the points of attachment may be on the same or different rings, each of which rings may be aromatic or non-aromatic, and optionally substituted with one or more substituents where indicated. Non-limiting examples include phenylene and naphthylene.

A "carbonylalkyl" group is an alkyl group having the specified number of carbon atoms attached via a carbonyl group.

A "carbonylalkoxy" group is an alkoxy group having the specified number of carbon atoms attached via a carbonyl group.

As used herein, when a definition is not otherwise provided, the term "substituted" may refer to a linear or branched C1 to C30 alkyl group, a C2 to C30 alkynyl group, a C6 to C30 aryl group, a C1 to C30 alkoxy group, a C1 to C30 heteroalkyl group, a C3 to C30 cycloalkyl group, a C3 to C15 cycloalkenyl group, a C6 to C30 cycloalkynyl group, a C2 to C30 heterocycloalkyl group, a halogen (F, Cl, Br, or I), a hydroxyl group, a nitro group (—$NO_2$), a cyano group (—CN), an amino group (—NRR', wherein R and R' are hydrogen or a C1 to C6 alkyl group), a thiol group (—SH), an ester group (—C(=O)OR wherein R is a C1 to C6 alkyl group or a C6 to C12 aryl group), a carboxyl group (—C(=O)OH) or a salt thereof (—C(=O)OM wherein M is an organic or inorganic cation), sulfonic acid group (—$SO_3H$) or a salt thereof (—SO₃M wherein M is an organic or inorganic cation), provided that the substituted atom's normal valence is not exceeded.

Throughout the present disclosure, reference is made to various heterocyclic groups. Within such groups, the prefix "hetero" refers to a group that includes at least one ring member (e.g., 1 to 4 ring members) that is a heteroatom (e.g., 1 to 4 heteroatoms, each independently being N, O, S, Si, or P).

As used herein, the term "aliphatic organic group" may refer to a linear or branched substituted or unsubstituted C1 to C30 alkyl group which may have up to 3 heteroatoms each independently being N, O, S, Si, or P, the term "aromatic organic group" may refer to a substituted or unsubstituted C6 to C30 aryl group or a substituted or unsubstituted C2 to C30 heteroaryl group, and the term "alicyclic organic group" may refer to a substituted or unsubstituted, C3 to C30 cycloalkyl group, a C3 to C30 cycloalkenyl group, and a C3 to C30 cycloalkynyl group, each of which each may contain up to 3 heteroatoms each independently being N, O, S, Si, or P.

As used herein, the term "combination thereof" refers to a mixture, a stacked structure, a composite, an alloy, a blend, a reaction product, or the like.

As used herein, (meth)acrylate refers to acrylate and methacrylate and (meth)acryloxy refers to acryloxy and methacryloxy.

According to an embodiment of the present invention, an optoelectronic device and stacking structure include a polymer film including a polymerized polymer a first monomer including at least two thiol (—SH) groups and a second monomer including at least two carbon-carbon unsaturated bond-containing groups at a terminal end, respectively, i.e., at least two carbon-carbon unsaturated bond-containing groups, one located proximal to at least one end and another located proximal to the same or another terminal end. In an embodiment each carbon-carbon unsaturated bond-containing group is located at a different terminal end.

The first monomer including at least two thiol (—SH) groups may be represented by the following Chemical Formula 1.

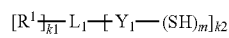

Chemical Formula 1

In Chemical Formula 1, $R^1$ is hydrogen, a substituted or unsubstituted C1 to C30 or C1 to C10 linear or branched alkyl group, a substituted or unsubstituted C6 to C30 or C6 to C12 aryl group, a substituted or unsubstituted C3 to C30 or C3 to C12 heteroaryl group, a substituted or unsubstituted C3 to C30 or C3 to C12 cycloalkyl group, a substituted or unsubstituted C3 to C30 or C3 to C12 heterocycloalkyl group, a C2 to C30 or C2 to C10 alkenyl group, a C2 to C30 or C2 to C10 alkynyl group, a substituted or unsubstituted C3 to C30 or C3 to C12 alicyclic organic group including a double bond or triple bond in a ring, a substituted or unsubstituted C3 to C30 or C3 to C12 heterocycloalkyl group including a double bond or triple bond in a ring, a C3 to C30 or C3 to C12 alicyclic organic group substituted with a C2 to C30 or C2 to C10 alkenyl group or a C2 to C30 or C2 to C10 alkynyl group, a C3 to C30 or C3 to C12 heterocycloalkyl group substituted with a C2 to C30 or C2 to C10 alkenyl group or a C2 to C30 or C2 to C10 alkynyl group, a hydroxyl group, —NH₂, a substituted or unsubstituted C1 to C60 or C1 to C20 amine group (—NRR', wherein R and R' are each independently a linear or branched C1 to C30 or C1 to C10 alkyl group), an isocyanurate group; a (meth)acrylate group, a halogen, —ROR' (wherein R is a substituted or unsubstituted C1 to C20 or C1 to C10 alkylene group and R' is hydrogen or a C1 to C20 or C1 to C10 linear or branched alkyl group), —C(═O)OR' (wherein R' is hydrogen or a C1 to C20 or C1 to C10 linear or branched alkyl group), —CN, or —C(═O)ONRR' (wherein R and R' are each independently hydrogen or a C1 to C20 or C1 to C10 linear or branched alkyl group);

$L_1$ is a single bond, a substituted or unsubstituted C1 to C30 or C1 to C10 alkylene group, a substituted or unsubstituted C6 to C30 or C6 to C12 arylene group, a substituted or unsubstituted C6 to C30 or C3 to C12 heteroarylene group, a substituted or unsubstituted C3 to C30 cycloalkylene group, or a substituted or unsubstituted C3 to C30 heterocycloalkylene group;

$Y_1$ is a single bond, a substituted or unsubstituted C1 to C30 or C1 to C10 alkylene group, a substituted or unsubstituted C2 to C30 or C2 to C10 alkenylene group, or a C1 to C30 or C1 to C10 alkylene group or a C2 to C30 or C2 to C10 alkenylene group wherein at least one methylene group is replaced by a sulfonyl group (—S(═O)₂—), a carbonyl group (—C(═O)—), an ether group (—O—), a sulfide group (—S—), a sulfoxide group (—S(═O)—), an ester group (—C(═O)O—), an amide group (—C(═O)NR—) (wherein R is hydrogen or a C1 to C10 linear or branched alkyl group), —NR— (wherein R is hydrogen or a C1 to C10 linear or branched alkyl group), or a combination thereof;

m is an integer of 1 or more;

k1 is an integer of 0 or 1 or more;

k2 is an integer of 1 or more; and the sum of m and k2 is an integer of 3 or more;

provided that m does not exceed the valence of $Y_1$; and provided that the sum of k1 and k2 does not exceed the valence of the $L_1$.

The second monomer may be represented by the following Chemical Formula 2.

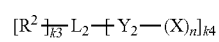

Chemical Formula 2

In Chemical Formula 2,

X is a C2 to C30 or C2 to C10 aliphatic organic group including a carbon-carbon unsaturated bond, a C6 to C30 or C6 to C12 aromatic organic group including a carbon-carbon double bond or a carbon-carbon triple bond, or a C3 to C30 or C3 to C12 alicyclic organic group including a carbon-carbon double bond or a carbon-carbon triple bond, $R^2$ is hydrogen, a substituted or unsubstituted C1 to C30 or C1 to C10 linear or branched alkyl group, a substituted or unsubstituted C6 to C30 or C6 to C12 aryl group, a substituted or unsubstituted C3 to C30 or C3 to C12 heteroaryl group, a substituted or unsubstituted C3 to C30 cycloalkyl group, a substituted or unsubstituted C3 to C30 heterocycloalkyl group, a substituted or unsubstituted C2 to C30 alkenyl group, a substituted or unsubstituted C2 to C30 alkynyl group, a substituted or unsubstituted C3 to C30 alicyclic organic group including a double bond or triple bond in a ring, a substituted or unsubstituted C3 to C30 heterocycloalkyl group including a double bond or triple bond in a ring, a C3 to C30 alicyclic organic group substituted with a C2 to C30 alkenyl group or a C2 to C30 alkynyl group, a C3 to C30 heterocycloalkyl group substituted with a C2 to C30 alkenyl group or a C2 to C30 alkynyl group, a hydroxyl group, —NH₂; a substituted or unsubstituted C1 to C60 amine group (—NRR', wherein R and R' are each independently hydrogen or a C1 to C30 linear or branched alkyl group), an isocyanate group, an isocyanurate group, a (meth)acryloxy group, a halogen, —ROR' (wherein R is a substituted or unsubstituted C1 to C20 alkylene group and R' is hydrogen or a C1 to C20 linear or branched alkyl group), an acyl halide group (—RC(=O)X, wherein R is a substituted or unsubstituted alkylene group and X is a halogen), —C(=O)OR' (wherein R' is hydrogen or a C1 to C20 linear or branched alkyl group), —CN, or —C(=O)ONRR' (wherein R and R' are each independently hydrogen or a C1 to C20 linear or branched alkyl group);

$L_2$ is a single bond, a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group;

$Y_2$ is a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a linear or branched C1 to C10 alkyl group), —NR— (wherein R is hydrogen or a linear or branched C1 to C10 alkyl group), or a combination thereof;

n is an integer of 1 or more, k3 is an integer of 0 or 1 or more; k4 is an integer of 1 or more; and the sum of n and k4 is an integer of 3 or more;

provided that n does not exceed the valence of $Y_2$; and provided that the sum of k3 and k4 does not exceed the valence of the $L_2$.

The first monomer of the above Chemical Formula 1 may include a monomer of the following Chemical Formula 1-1.

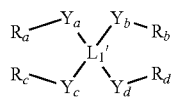

Chemical Formula 1-1

In Chemical Formula 1-1, $L_1'$ is a substituted or unsubstituted C1 to C30 alkylene group, a substituted or unsubstituted C6 to C30 arylene group, for example a substituted or unsubstituted phenylene group, a substituted or unsubstituted C3 to C30 heteroarylene group, for example a triazine, a substituted or unsubstituted C3 to C30 cycloalkylene group, or a substituted or unsubstituted C3 to C30 heterocycloalkylene group, for example a trioxotriazine group such as in Formula 1-5 below;

$Y_a$ to $Y_d$ are each independently substituted or unsubstituted C1 to C30 alkylene group, a substituted or unsubstituted C2 to C30 alkenylene group, or a C1 to C30 alkylene group or a C2 to C30 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a linear or branched C1 to C10 alkyl group), or —NR— (wherein R is hydrogen or a linear or branched C1 to C10 alkyl group); and $R_a$ to $R_d$ are a thiol group (SH); or one or more of —$R_a$—$Y_a$—, —$R_b$—$Y_b$—, —$R_c$—$Y_c$—, and $R_d$—$Y_d$— are $R_1$ of Chemical Formula 1, provided that at least two of $Y_a$ to $Y_d$ are as defined above and at least two of $R_a$ to $R_d$ are a thiol group (—SH).

Specific examples of the first monomer represented by the above Chemical Formula 1 may include the compounds represented by the following Chemical Formulae 1-2 to 1-5.

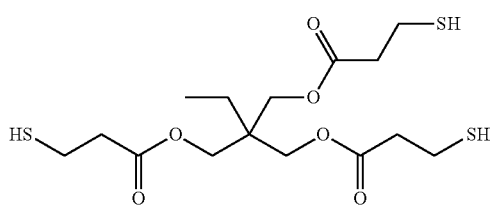

Chemical Formula 1-2

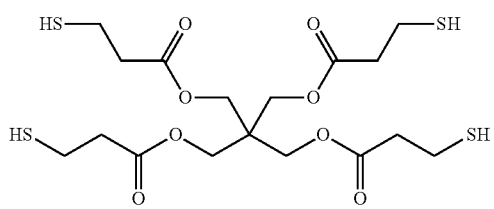

Chemical Formula 1-3

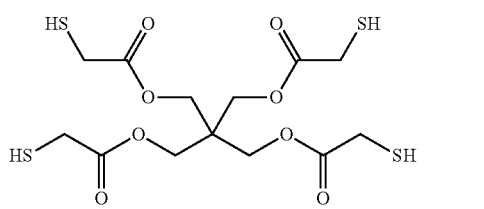

Chemical Formula 1-4

Chemical Formula 1-5

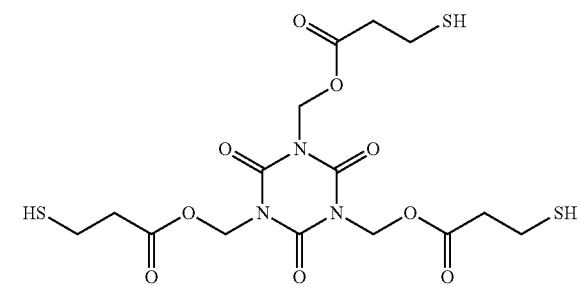

In Chemical Formula 2,

X is a C2 to C30 aliphatic organic group including a carbon-carbon double bond or a carbon-carbon triple bond, a C6 to C30 aromatic organic group including a carbon-carbon double bond or a carbon-carbon triple bond, or a C3 to C30 alicyclic organic group including a carbon-carbon double bond or a carbon-carbon triple bond. X may be an acryloxy group, a methacryloxy group, a substituted or unsubstituted C2 to C30 alkenyl group, a substituted or unsubstituted C2 to C30 alkynyl group, a substituted or unsubstituted C3 to C30 alicyclic organic group including a double bond or triple bond in a ring, a substituted or unsubstituted C3 to C30 heterocycloalkyl group including a double bond or triple bond in a ring, a C3 to C30 alicyclic organic group substituted with a C2 to C30 alkenyl group or a C2 to C30 alkynyl group, or a C3 to C30 heterocycloalkyl group substituted with a C2 to C30 alkenyl group or a C2 to C30 alkynyl group.

In the definitions of X of Chemical Formula 2, X may be a vinyl group, an allyl group, a 2-butenyl group, or a combination thereof. The X group may also be a norbornene group, a maleimide group, a nadimide group, a tetrahydrophthalimide group, or a combination thereof.

In Chemical Formula 2, $L_2$ may be a substituted or unsubstituted pyrrolidinyl group, a substituted or unsubstituted tetrahydrofuranyl group, a substituted or unsubstituted pyridyl group, a substituted or unsubstituted pyrimidyl group, a substituted or unsubstituted piperidyl group, a substituted or unsubstituted triazinyl group, a substituted or unsubstituted trioxotriazinyl group such as in Chemical Formula 2-4 below, or a substituted or unsubstituted isocyanurate group.

The second monomer of the above Chemical Formula 2 may include the compounds represented by the following Chemical Formulae 2-1 and 2-2.

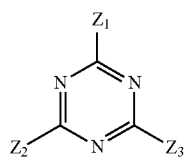

Chemical Formula 2-1

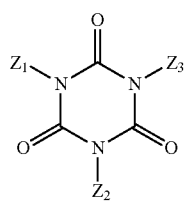

Chemical Formula 2-2

In Chemical Formulae 2-1 and 2-2, $Z_1$ to $Z_3$ are each independently *—$Y_2$—$X_n$ as defined for the above Chemical Formula 2, wherein * represents the point of attachment to $L_2$.

Examples of the second monomer of the above Chemical Formula 2 may include the compounds represented by the following Chemical Formulae 2-3 to 2-5.

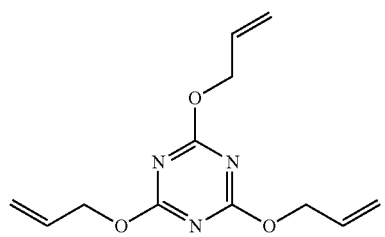

Chemical Formula 2-3

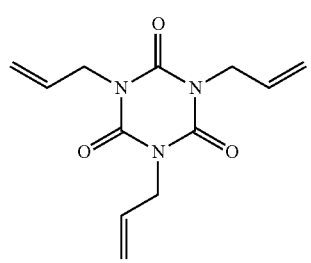

Chemical Formula 2-4

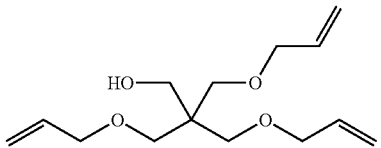

Chemical Formula 2-5

The first monomer and the second monomer may be used so that the thiol group of the first monomer and the unsaturated carbon-carbon bond of the second monomer may be present at a mole ratio of about 1:0.75 to about 1:1.25. When the above first and second monomers are used within the mole ratio range, a polymer having excellent mechanical strength and properties due to a high density network may be provided.

The polymer may be a polymerized product which is obtained by further polymerizing a third monomer having one thiol group located at a terminal end of the third monomer, a fourth monomer having one unsaturated carbon-carbon bond located at a terminal end of the fourth monomer, or a combination thereof.

The third monomer may be a compound in which each m and k2 is 1 in Chemical Formula 1, and the fourth monomer may be a compound in which each n and k4 is 1 in Chemical Formula 2.

The first monomer and the second monomer, and optionally the third monomer and/or the fourth monomer may be polymerized under the presence of an initiator for accelerating the cross-linking reaction of the thiol group and carbon-carbon unsaturated bond. The initiator may include phosphine oxide, α-amino ketone, phenylglyoxylate, monoacyl phosphine, benzylmethyl-ketal, hydroxyketone, and the like.

The polymer may be cured at room temperature for a short time, so that the high temperature process that may deteriorate the stability of the light emitting particles may be omitted. The polymer film may block extraneous factors such as oxygen, moisture, or the like, by providing a close cross-linking structure. The polymer film may have a thickness of about 5 micrometers ("μm") to about 1000 μm, or specifically about 50 μm to about 300 μm. When the polymer film has a thickness within this range, it may sufficiently block the extraneous factors of oxygen, moisture, or the like.

The optoelectronic device includes a light source; an emission layer disposed on the light source and including a light emitting particle dispersed in a matrix polymer; and a polymer film disposed on the emission layer.

The stacking structure includes a composite layer including a matrix polymer and a light emitting particle dispersed in the matrix polymer, and a polymer film disposed on the composite layer.

The optoelectronic device may further include an additional polymer film including an organic/inorganic hybrid polymer disposed between the emission layer and the polymer film.

The stacking structure may further include an additional polymer film including an organic/inorganic hybrid polymer disposed between the composite layer and the polymer film.

The organic/inorganic hybrid polymer may be present at an interface between the matrix polymer in which a light emitting particle is dispersed and the polymer of the polymer film, and thus improves adherence and uniformity of the polymer film.

The organic/inorganic hybrid polymer may include a first moiety including a siloxane bond (—Si—O—Si—), a second moiety including a siloxane bond and at least one organic functional group, and a third moiety including a siloxane bond and a cross-linked structure of at least one reactive functional group.

The organic/inorganic hybrid polymer may further include a fourth moiety including a —O-M-O— bond (wherein, M is Al, Sn, Ti, Zr, Ge, B, or a combination thereof).

The organic/inorganic hybrid polymer may be a condensation polymerization polymer of a first alkoxy silane represented by the following Chemical Formula 3, a second alkoxy silane represented by the following Chemical Formula 4, and a third alkoxy silane represented by the following Chemical Formula 5.

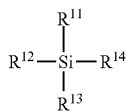

Chemical Formula 3

In Chemical Formula 3,
$R^{11}$ to $R^{14}$ are each independently a hydroxyl group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group.

Examples of the alkoxy silane represented by the above Chemical Formula 3 may include tetramethoxysilane, tetraethoxysilane, tetrabutoxysilane, and the like.

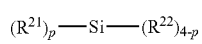

Chemical Formula 4

In Chemical Formula 4,
$R^{21}$ is a substituted or unsubstituted C6 to C20 aryl group, a substituted or unsubstituted C1 to C20 linear or branched alkyl group, for example a fluoroalkyl group, a substituted or unsubstituted C1 to C20 aminoalkyl group, a substituted or unsubstituted C2 to C20 alkynyl group, C2 to C20 alkenyl group, a substituted or unsubstituted C1 to C20 amine group, —C(=O)OR' (wherein R' is a C1 to C20 linear or branched alkyl group), or —C(=O)ONRR' (wherein R and R' are each independently a C1 to C20 linear or branched alkyl group);

$R^{22}$ is a hydroxyl group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group; and p is an integer ranging from 1 to 3.

Examples of the alkoxy silane represented by the above Chemical Formula 4 may include methyltrimethoxysilane, ethyltrimethoxysilane, propyltrimethoxysilane, butyltrimethoxysilane, pentyltrimethoxysilane, hexyltrimethoxysilane, methyltriethoxysilane, ethyltriethoxysilane, propyltriethoxysilane, butyltriethoxysilane, pentyltriethoxysilane, hexyltriethoxysilane, dimethyldimethoxysilane, diethyldimethoxysilane, dipropyldimethoxysilane, dibutyldimethoxysilane, dipentyldimethoxysilane, dihexyldimethoxysilane, dimethyldiethoxysilane, diethyldiethoxysilane, dipropyldiethoxysilane, dibutyldiethoxysilane, dipentyldiethoxysilane, dihexyldiethoxysilane, aminomethyltrimethoxysilane, aminoethyltrimethoxysilane, aminopropyltrimethoxysilane, aminobutyltrimethoxysilane, aminopentyltrimethoxysilane, aminohexyltrimethoxysilane, aminomethyltriethoxysilane, aminoethyltriethoxysilane, aminopropyltriethoxysilane, aminobutyltriethoxysilane, aminopentyltriethoxysilane, aminohexyltriethoxysilane, phenyltrimethoxysilane, diphenyldimethoxysilane, phenyltriethoxysilane, diphenyldiethoxysilane, and the like.

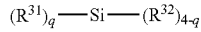

Chemical Formula 5

In Chemical Formula 5,
$R^{31}$ is a reactive photo-cross-linking or a thermal cross-linking functional group, for example, a (meth)acryloxy group, an epoxy group, for example a glycidyloxy group, a spiroorthoester group, a substituted or unsubstituted C2 to C30 alkenyl group, a substituted or unsubstituted C2 to C30 alkynyl group, a substituted or unsubstituted C3 to C30 alicyclic organic group including a double bond or triple bond in a ring, a substituted or unsubstituted C3 to C30 heterocycloalkyl group including a double bond or triple bond in a ring, a C3 to C30 alicyclic organic group substituted with a C2 to C30 alkenyl group or a C2 to C30 alkynyl group, and a C3 to C30 heterocycloalkyl group substituted with a C2 to C30 alkenyl group or a C2 to C30 alkynyl group;

$R^{32}$ is a hydroxyl group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or substituted or unsubstituted C2 to C10 carbonylalkoxy group; and q is an integer ranging from 1 to 3.

The organic/inorganic hybrid polymer may be a condensation polymerization polymer of the alkoxy silane compounds represented by the above Chemical Formulae 3 to 5 and an alkoxide compound represented by the following Chemical Formula 6.

Chemical Formula 6

In Chemical Formula 6,
R is a hydroxyl group, a halogen, a substituted or unsubstituted C1 to C8 linear or branched alkoxy group, for example, a methoxy, an ethoxy, an isopropoxy, or a t-butoxy, a substituted or unsubstituted C6 to C12 aryloxy group, a substituted or unsubstituted C2 to C10 carbonylalkyl group, or substituted or unsubstituted C2 to C10 carbonylalkoxy group;

M is Al, Si, Sn, Ti, Zr, Ge, B, or a combination thereof, and r is determined depending on a bonding valence of M.

The first to third moieties may be derived from the above Chemical Formulae 3 to 5, respectively. The first alkoxy silane represented by Chemical Formula 3 undergoes a condensation polymerization to provide a first moiety including a siloxane bond (—Si—O—Si—), the second alkoxy silane represented by Chemical Formula 4 undergoes a condensation polymerization to provide a second moiety including a siloxane bond and at least one organic functional group, and the third alkoxy silane represented by Chemical Formula 5 undergoes a condensation polymerization to provide a third moiety including a siloxane bond and a cross-linked structure of at least one reactive functional groups. Therefore, the organic functional group of the second moiety may be $R^{21}$ of Chemical Formula 4, and the cross-linked organic functional group of the third moiety is provided by cross-linking $R^{31}$, a reactive photo-cross-linking or a thermal cross-linking functional group of Chemical Formula 5.

The second moiety may increase flexibility and a refractive index of the condensation polymerization polymer.

The first alkoxy silane, the second alkoxy silane and the third alkoxide compound may each be used at an amount of about 0.5 to about 55 wt %, about 35 to about 99 wt %, and about 0.01 to about 10 wt %. The first alkoxy silane may be used at an amount of about 50 to about 55 wt %. When the first alkoxy silane, second alkoxy silane, and third alkoxy silane undergo a condensation polymerization within the above range, a polymer film having an excellent refractive index, as well as photo-stability and thermal stability, results.

The additional polymer film including the organic/inorganic hybrid polymer has a thickness of about 5 μm to about 200 μm, and specifically about 20 μm to about 100 μm. Within this thickness range, compatibility between the matrix polymer and polymer film may be improved.

The polymer film efficiently protects the light emitting particles that are susceptible to oxygen or moisture and thereby maintains the optical properties of the device. For example, the polymer film may be utilized in various physiological fields, as well as in an optoelectronic device, such as a light emitting element of a light emitting diode ("LED") device or an organic light emitting diode ("OLED"), a memory device, a laser device, a solar cell, or the like.

An optoelectronic device, in particular a light emitting diode device, according to an embodiment is described with reference to FIGS. 1 and 2.

Figure 2:
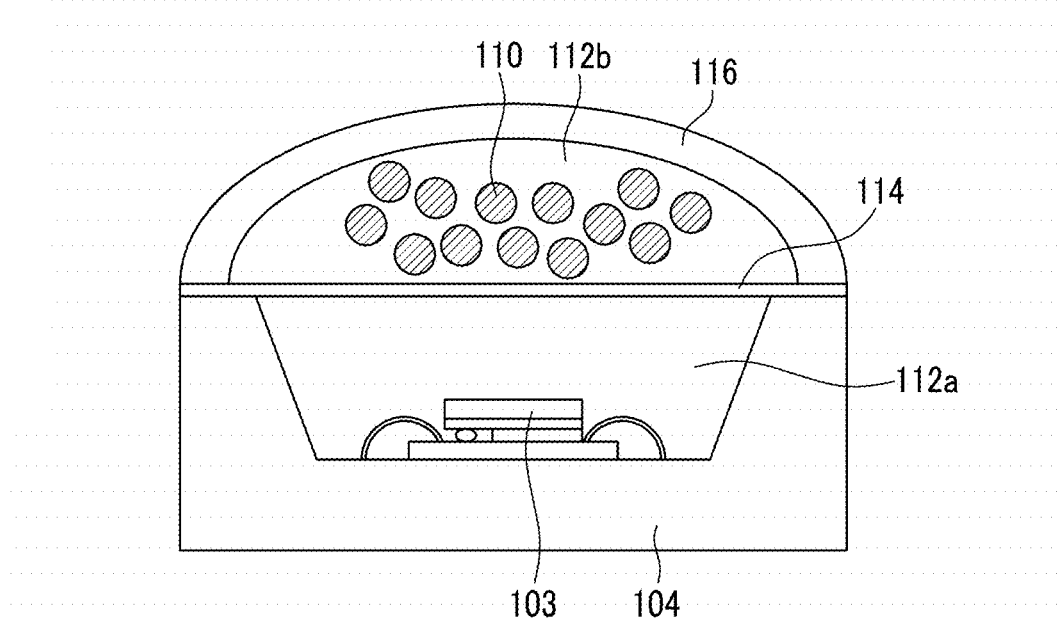
FIG. 2 is a cross-sectional view of a light emitting diode device according to another embodiment.

FIGS. 1 and 2 are cross-sectional views showing light emitting diode devices according to the various embodiments of the present invention.

Referring to FIG. 1, the light emitting diode device includes a substrate 104 including Ag or the like, a light emitting diode chip 103 disposed on the substrate 104 and corresponding to the blue or ultraviolet region, and light emitting particles 110 disposed on the light emitting diode chip 103, wherein the light emitting particles 110 are dispersed in a matrix polymer 112. The outer surface of the light emitting diode device is encapsulated with a polymer film 116.

As a light source of the light emitting diode device, a laser, a lamp, or the like may be used instead of the light emitting diode chip.

The light emitting particles 110 may be red, green, yellow, or blue-emitting light emitting particles. The light emitting particles may be selected from a nanocrystal, a phosphor, a pigment, or a combination thereof. The nanocrystal may be selected from a semiconductor nanocrystal, a metal nanocrystal, a metal oxide nanocrystal, or a combination thereof. The semiconductor nanocrystal may include a Group II-VI compound, a Group III-V compound, a Group IV-VI compound, a Group IV element, a Group IV compound, or a combination thereof, wherein the term "Group" refers to a group of the Periodic Table of the Elements.

The Group II-VI compound includes a binary compound selected from CdSe, CdTe, ZnS, ZnSe, ZnTe, ZnO, HgS, HgSe, HgTe, MgSe, MgS, and a mixture thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; or a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group III-V compound includes a binary compound selected from GaN, GaP, GaAs, GaSb, AlN, AlP, AlAs, AlSb, InN, InP, InAs, InSb, and a mixture thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, GaAlNP, and a mixture thereof; or a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group IV-VI compound includes a binary compound selected from SnS, SnSe, SnTe, PbS, PbSe, PbTe, and a mixture thereof; a ternary compound selected from SnSeS, SnSeTe, SnSTe, PbSeS, PbSeTe, PbSTe, SnPbS, SnPbSe, SnPbTe, and a mixture thereof; or a quaternary compound selected from SnPbSSe, SnPbSeTe, SnPbSTe, and a mixture thereof. The Group IV element includes Si or Ge, and the Group IV compound includes a binary compound selected from SiC, SiGe, or a combination thereof.

According to an embodiment, the element, the binary compound, the ternary compound, or the quaternary compound may be present in a particle having a substantially uniform concentration, or may be present in a particle having different concentration distributions in the same particle. In addition, each particle may have a core/shell structure in which a first semiconductor nanocrystal is surrounded by a second semiconductor nanocrystal. The core and shell may have an interface, and an element of at least one of the core or the shell may have a concentration gradient that decreases in a direction from the surface of the particle to a center of the particle.

In addition, the semiconductor nanocrystal may have a structure including a semiconductor nanocrystal core and a multi-layer shell surrounding the same. The multi-layer shell may have a two or more layered shell structure. Each layer may have a single composition or an alloy or concentration gradient.

In addition, the semiconductor nanocrystal may have a structure effectively showing the quantum confinement effect since the material composition for the shell has a higher energy band gap than that of the core. In the case of having a multi-layered shell, the energy band gap of the shell disposed on the exterior of the core is higher than the shell closer to the core. The semiconductor nanocrystal may have an ultraviolet ("UV") to infrared wavelength range.

The semiconductor nanocrystal may have quantum efficiency of about 30% to about 100%, for example, about 50% or more, or 70% or more, or about 90% or more. Within the range, it may improve the luminous efficiency of a device.

In addition, the full width of half maximum ("FWHM") of the light emitting wavelength spectrum of the semiconductor nanocrystal may be designed to be narrower or wider according to the application field. It may have a narrower spectrum in order to improve the color purity or the color reproducibility in a display. In this regard, the semiconductor nanocrystal may have the FWHM of light emitting wavelength spectrum of about 50 nanometers ("nm") or less, for example, about 40 nm or less, or about 30 nm or less. In the range, it may improve the color purity or the color reproducibility of the device. In addition, when the semiconductor nanocrystal is used for lighting or the like, the semiconductor nanocrystal having the various light emitting wavelengths is mixed in order to improve the color rendering index ("CRI"), or the FWHM is designed to be wider. In this case, the FWHM may range from about 100 nm to about 200 nm.

The semiconductor nanocrystal may have a particle diameter (e.g., an average largest particle diameter) ranging from about 1 nanometer ("nm") to about 100 nm, and specifically about 1 nm to about 10 nm.

In addition, the nanocrystal may have a commonly-used shape in this art so the shape is not specifically limited. Examples thereof may include spherical, pyramid, multi-arm, or cubic nanoparticles, nanotubes, nanowires, nanofiber, nanoplate particles, or the like.

The nanocrystal may be synthesized according to a general method known in this art. For example, the nanocrystal may be synthesized according to the following method. The method of synthesizing the nanocrystal is not limited to the following method, and it may be synthesized according to any conventional method known in the arts.

For example, several nano-sized semiconductor nanocrystals may be synthesized according to a wet chemical process that adds a precursor material into an organic solvent and develops the particles. This is a method of controlling crystal development by naturally coordinating an organic solvent or an organic ligand on the surface of the semiconductor nanocrystal while the crystal is developed. The organic solvent coordinated on the surface of the nanocrystal may affect the stability in the device, so excessive organic material that is not coordinated on the surface of the nanocrystal may be removed by washing three times and centrifuging. After removing the excessive organic material, the amount of organic material coordinated on the surface of the nanocrystal may be about 50 wt % or less of the nanocrystal weight. With a nanocrystal size of about 20 nm or less, the organic material is coordinated in a range of about 10 to about 50 wt %, for example, about 15 to about 30 wt %, based on the weight of the nanocrystal. The organic material may be a monomer or an oligomer having a molecular weight of about 300 grams/mole or more or a polymer having a molecular weight ("Mw") of about 5000 grams/mole or more.

The phosphor and pigment may be a commonly-used phosphor and pigment, and is not specifically limited. The phosphor or pigment may have a particle diameter (e.g., an average largest particle diameter) ranging from about 1 nanometer ("nm") to about 100 nm, and specifically about 1 nm to about 10 nm.

The light emitting particle may further include a coating including a polymer having a carboxyl group or a salt thereof. Thus, the light emitting particles may be coated with a polymer having a carboxyl group or a salt thereof. The carboxyl group may include an acrylic acid group, a methacrylic acid group, or a salt thereof. The polymer having a carboxyl group or a salt thereof may include about 1 to about 100 mol %, specifically about 2 to about 50 mol %, more specifically about 4 to about 20 mol % of a structural unit including the carboxyl group or a salt thereof. When the structural unit including a carboxyl group or a salt thereof is included within the above range in the polymer, the stability of the light emitting particles may be improved. The polymer may have a melting point ("$T_m$") of about 50° C. to about 300° C., specifically about 60° C. to about 250° C., more specifically about 70° C. to about 200° C. When the polymer has a melting point within the above range, the polymer may stably coat the light emitting particle.

The coated light emitting particle may be present as a powder or as a film. A coated light emitting particle in a form of a powder and a matrix polymer may be combined to provide a composite, or alternatively, a coated light emitting particle in a form of a film and a matrix polymer may be combined to provide a composite. The polymer having a carboxyl group or a salt thereof may include the carboxyl group or a salt thereof in a long aliphatic chain, for example a C8 to C50 or a C12 to C36 aliphatic chain.

The polymer having a carboxyl group or a salt thereof may include a poly(alkylene-co-acrylic acid) such as polyethylene-co-acrylic acid), a poly(alkylene-co-methacrylic acid) such as polyethylene-co-methacrylic acid), a salt thereof, or a combination thereof. The salt may be a compound including a metal such as sodium, zinc, indium, gallium, or the like, instead of a hydrogen of the carboxyl group. Examples of the salt include a poly(ethylene-co-acrylic acid) zinc salt, a poly(ethylene-co-methacrylic acid) zinc salt, or the like.

The polymer having a carboxyl group or a salt thereof may be present in an amount of about 50 to about 10,000 parts by weight, and specifically about 200 to about 10,000 parts by weight, based on 100 parts by weight of the light emitting particle. In the light emitting particle coated with the polymer having a carboxyl group or a salt thereof, the light emitting particles may be present in an amount of about 1 to about 70 wt %, and specifically about 1 to about 50 wt %, based on the total weight of the light emitting particles and the polymer having a carboxyl group or a salt thereof. When the composition of the coated light emitting particles is within the foregoing range, stability of the light emitting particles may be improved.

The matrix polymer 112 of FIG. 1 may be selected from a silicone resin, an epoxy resin, or a (meth)acrylate-based resin. In an embodiment for the matrix polymer 112, a silicone resin having excellent affinity for the organic/inorganic hybrid polymer may be desirable.

Referring to FIG. 2, the light emitting diode device includes a substrate 104 including Ag or the like, a light emitting diode chip 103 disposed on the substrate and corresponding to the blue or ultraviolet ("UV") region, and a matrix polymer 112a filled in the recess portion of substrate 104. It may include a transparent plate 114 on the first matrix polymer 112a, and a second matrix polymer 112b and light emitting particles 110 dispersed in the same are disposed on the transparent plate 114. Thus, the transparent plate 114 is disposed between the light source 103 and the emission layer. The transparent plate 114 may be made of glass or a transparent polymer.

The first matrix polymer 112a may be the same as or different from the second matrix polymer 112b. The first matrix polymer 112a may be a silicone resin having excellent transparency and refractive index characteristics and a high thermal stability, and the second matrix polymer 112b may be a polymer that improves the characteristics of uniformly dispersing the light emitting particles such as a silicone resin, an epoxy resin, a (meth)acrylate-based resin, or the like.

The transparent plate 114 may prevent deterioration of the light emitting particles 110 by the light emitting diode chip. The outer surface of the light emitting diode device is encapsulated with a polymer film 116.

The polymer film 116 includes a copolymer of a first monomer including at least two thiol (—SH) groups and a second monomer including at least two carbon-carbon unsaturated bond-containing groups at a terminal end. Herein, the copolymer of the first monomer including at least two thiol (—SH) groups and the second monomer including at least two carbon-carbon unsaturated bond-containing groups at a terminal end may be polymerized in various mole ratios, and the mole ratio for the polymerization is not limited to any predetermined range.

Figure 3:
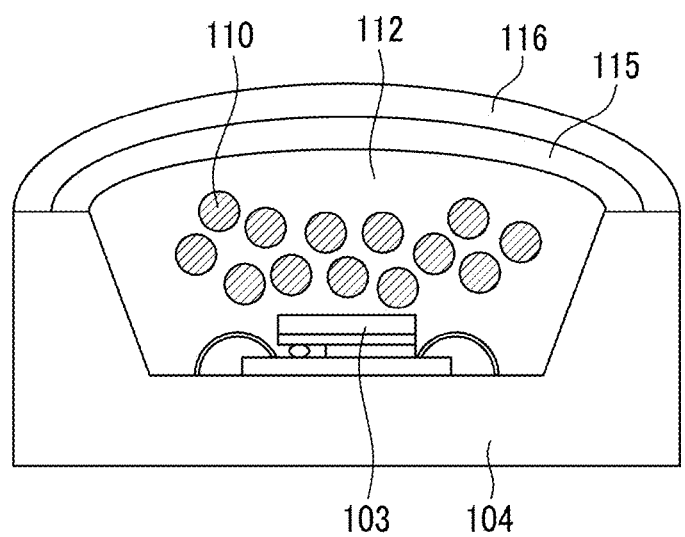
FIG. 3 is a cross-sectional view of a light emitting diode device according to yet another embodiment of the present invention.

FIG. 3 is a cross-sectional view of a light emitting diode device according to yet another embodiment of the present invention. As shown in FIG. 3, a polymer layer 115 including an organic/inorganic hybrid polymer including a first moiety including a siloxane bond (—Si—O—Si—), a second moiety including a siloxane bond and at least one organic functional group, a third moiety including a siloxane bond and a cross-linked structure of at least one reactive functional groups may be further present under the polymer film 116. The organic/inorganic hybrid polymer may be the same as described above.

The polymer layer 115 including the organic/inorganic hybrid polymer improves interface adherence between the second matrix polymer 112b and polymer film 116 and uniformity.

The light emitting particle 110 absorbs the light emitting energy of the light emitting diode chip 103 and emits the excited energy as light having a different wavelength. The light emitting particle 110 may control the light emitting wavelength in various ways. For example, when a red light emitting particle and a green light emitting particle are associated with a blue light emitting diode, it may provide a white light emitting diode device. Alternatively, when red, green, and blue light emitting particles are associated with the ultraviolet ("UV") light emitting diode chip, it may provide a white light emitting diode device. In addition, when a light emitting particle emitting light in various wavelengths is associated with a light emitting diode chip, it may provide a light emitting diode emitting light in the various wavelengths.

Hereinafter, the embodiments are illustrated in more detail with reference to examples. However, the following are exemplary embodiments and are not limiting of the claims.

Preparation Example 1

Synthesis of a Nanocrystal

About 16 grams ("g") of trioctylamine (TOA), about 0.3 g of octadecyl phosphonic acid, and 0.4 millimoles ("mmol") of cadmium oxide are simultaneously introduced into a 125 milliliter ("ml") flask mounted with a reflux condenser and under vacuum while undergoing agitation, and heated to about 120° C. Then, after the temperature reaches about 120° C., nitrogen is flowed therein and the reaction temperature is controlled to about 300° C.

Separately, selenium (Se) powder is dissolved in trioctylphosphine (TOP) to provide a Se-TOP complex solution having a Se concentration of about 2 Molar ("M"). About 2 ml of 2 M Se-TOP complex solution is injected into the reaction mixture that is agitated at about 300° C. at a high speed and reacted for about 2 minutes.

After completing the reaction, the temperature of the reaction mixture is cooled as quickly as possible to room temperature, and a non-solvent of ethylene is added and centrifugation is performed. The supernatant of the solution excluding the centrifuged precipitant is discarded, and the precipitant is dispersed in toluene to synthesize a CdSe nanocrystal solution emitting light at 485 nm.

About 8 g of TOA, about 0.1 g of oleic acid, and about 0.4 mmol of zinc acetate are simultaneously introduced into a 125 ml flask mounted with a reflux condenser, and the reaction temperature is controlled to about 300° C. while agitating it. About 1 wt % of the synthesized CdSe nanocrystal solution is added into the reactant, and about 2 ml of 0.4 M S-TOP complex solution is slowly added thereto and reacted for about one hour to develop ZnS nanocrystal on the CdSe nanocrystal surface and to provide a CdSe/ZnS alloy nanocrystal through diffusion at the interface.

After completing the reaction, the temperature of the reaction mixture is cooled to room temperature as quickly as possible, and a non-solvent of ethanol is added thereto and centrifugation is performed. The supernatant of the solution excluding the centrifuged precipitant is discarded, and the precipitant is dispersed in toluene to synthesize a CdSe/ZnS alloy nanocrystal solution emitting light at 458 nm and having a size of about 5 nm.

About 8 g of TOA, about 0.1 g of oleic acid, about 0.05 mmol of cadmium oxide, and about 0.4 mmol of zinc acetate are simultaneously introduced into a 125 ml flask mounted with a reflux condenser, and the reaction temperature is controlled to about 300° C. while agitating it. About 1 wt % of the synthesized CdSe/ZnS nanocrystal solution is added into the reactant and about 2 ml of 0.4 M S-TOP complex solution is slowly added thereto and reacted for about one hour to develop the CdSZnS nanocrystal on the CdSe/ZnS nanocrystal surface and to provide a CdSe/ZnS/CdSZnS nanocrystal emitting light at about 535 nm.

After completing the reaction, the reaction mixture is cooled to room temperature as quickly as possible, and a non-solvent of ethanol is added thereto and centrifugation is performed. The supernatant of the solution excluding the centrifuged precipitant is discarded, and the precipitant is dispersed in toluene to synthesize the CdSe/ZnS/CdSZnS nanocrystal solution. It is confirmed that the quantum efficiency of the nanocrystal is about 93%.

Comparative Example 1

Fabrication of Light Emitting Diode ("LED") Device

The CdSe/ZnS/CdSZnS semiconductor nanocrystal emitting light at about 535 nm obtained from Preparation Example 1 is added with a solution in which hexane and ethanol are mixed at a volume ratio of about 6:4 and centrifuged at about 6000 revolutions per minute ("RPM") for about 10 minutes to provide a precipitant.

A chloroform solvent is added to the obtained precipitant to provide about 1 wt % of solution. Silicone resins (EG6301 A and EG6301 B manufactured and sold by Dow Corning) are preliminarily mixed at a weight ratio of about 1:1 to remove vapor from the silicone resin. About 1 wt % of the semiconductor nanocrystal, about 100 microliters (μl) of chloroform solution, and about 0.5 g of silicone resin are mixed and uniformly agitated and maintained for about 1 hour under vacuum to remove the chloroform solution. About 10 μl of silicone resin including no QD is coated on the blue light emitting diode formed in a surface mount device ("SMD") shape and contacted and sealed with a glass plate having a thickness of about 0.2 mm to correspond to the size of an LED mold, and then the silicone resin including the semiconductor nanocrystal is coated on a glass plate at about 5 μl and cured at about 150° C. for about 2 hours to provide a light emitting diode device.

Example 1

Fabrication of Light Emitting Diode ("LED") Device

A pentaerythritol tetrakis(3-mercaptopropionate) monomer and a 1,3,5-triallyl-1,3,5-triazine-2,4,6-trione monomer are mixed at a 1:1 mole ratio, and then for a photoinitiator, 1 wt % of oxy-phenyl-acetic acid 2-[2-oxo-2-phenyl-acetoxy-ethoxy]-ethyl ester is mixed therewith to prepare a solution. The solution is applied on the cured silicone resin of the light emitting diode device according to Comparative Example 1 and is exposed to i-line with 10,000 milliWatts per square centimeter ("mW/cm$^2$") of UV for about 10 minutes to fabricate a light emitting diode device encapsulated with a polymer film.

Example 2

Fabrication of Light Emitting Diode ("LED") Device

For a photoinitiator, 1 wt % of bis-acyl-phosphine oxide is mixed with Ormocore (manufactured by Fraunhofer) to prepare a composition. The composition is applied on the cured silicone resin of the light emitting diode device prepared according to Comparative Example 1 and is exposed to i-line with 10,000 mW/cm² of UV for about 10 minutes to provide a polymer layer including an organic/inorganic hybrid polymer. Then a pentaerythritol tetrakis (3-mercaptopropionate) monomer and a 1,3,5-triallyl-1,3,5-triazine-2,4,6-trione monomer are mixed at a 1:1 mole ratio, and then for a photoinitiator, 1 wt % of oxy-phenyl-acetic acid 2-[2-oxo-2-phenyl-acetoxy-ethoxy]ethyl ester is mixed therewith to prepare a solution. The solution is applied on the polymer layer and is exposed to i-line with 10,000 mW/cm² of UV for about 10 minutes to provide a polymer film.

Figure 4:
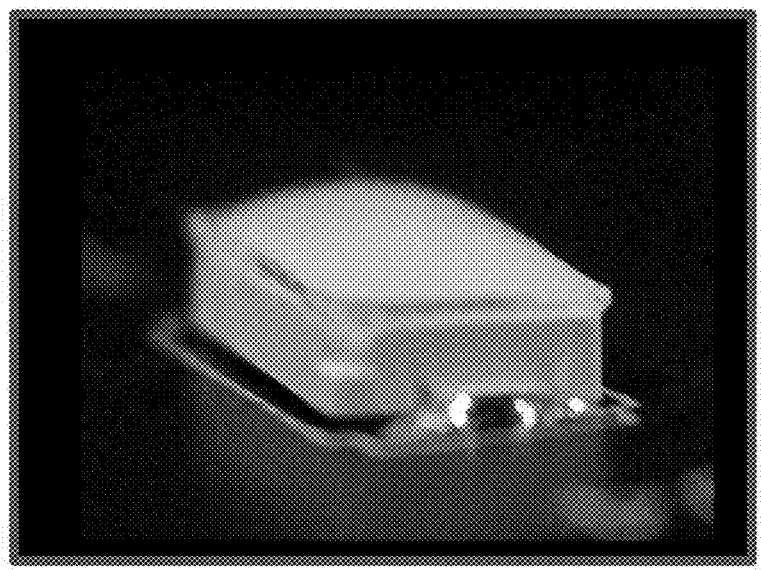
FIGS. 4 and 5 are photographs of a light emitting diode device according to Comparative Example 1 without a polymer film and a light emitting diode according to Example 2 with a polymer film.
Figure 5:
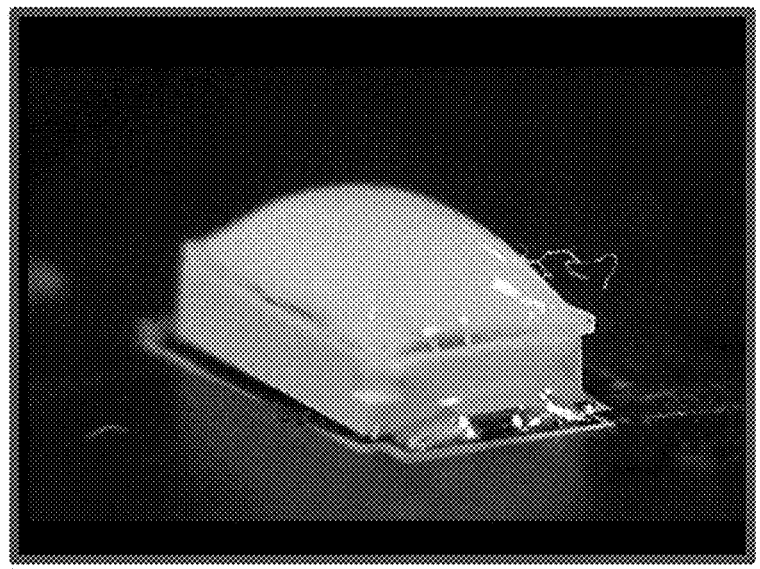

Photographs of a light emitting diode device according to Comparative Example 1 without a polymer film and a light emitting diode device according to Example 2 with a polymer film are shown in FIGS. 4 and 5. In FIGS. 4 and 5, the outer surface of the light emitting diode device with a polymer film is similar to the outer surface of the light emitting diode device without a polymer film. This indicates that the polymer film has excellent interface contact properties of with the silicone resin.

Figure 6:
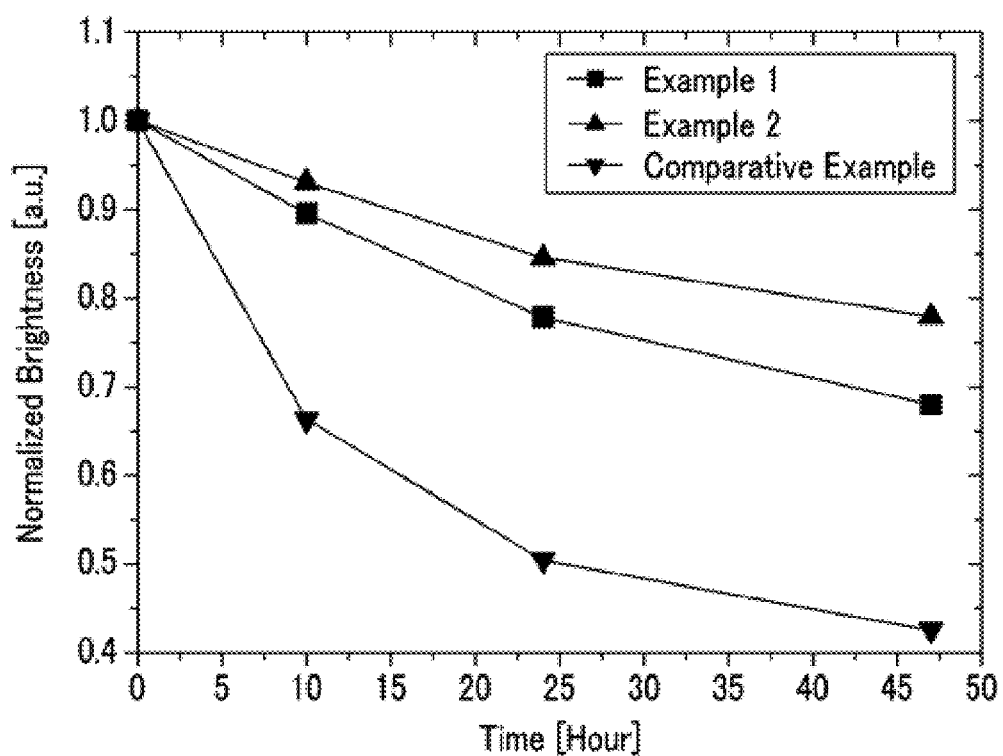
FIG. 6 shows brightness changes depending on operating times of light emitting diodes according to Comparative Example 1 and Examples 1 and 2.

Light emitting spectra and efficiency of the light emitting diode device according to Comparative Example 1 and Examples 1 and 2 are measured using a ISP75 system to evaluate light emitting properties in an integrating sphere. The light emitting diode devices are operated at 120 milli-Amps ("mA")/3.3 volts ("V") at 60° C. under a relative humidity of 95% and the stability is evaluated. The results are shown in FIG. 6. As shown in FIG. 6, brightness of the light emitting diode device without a polymer film according to Comparative Example 1 is remarkably reduced over time, whereas brightness of the light emitting diode devices according to Examples 1 and 2 is maintained uniformly over the same length of time.

Figure 7:
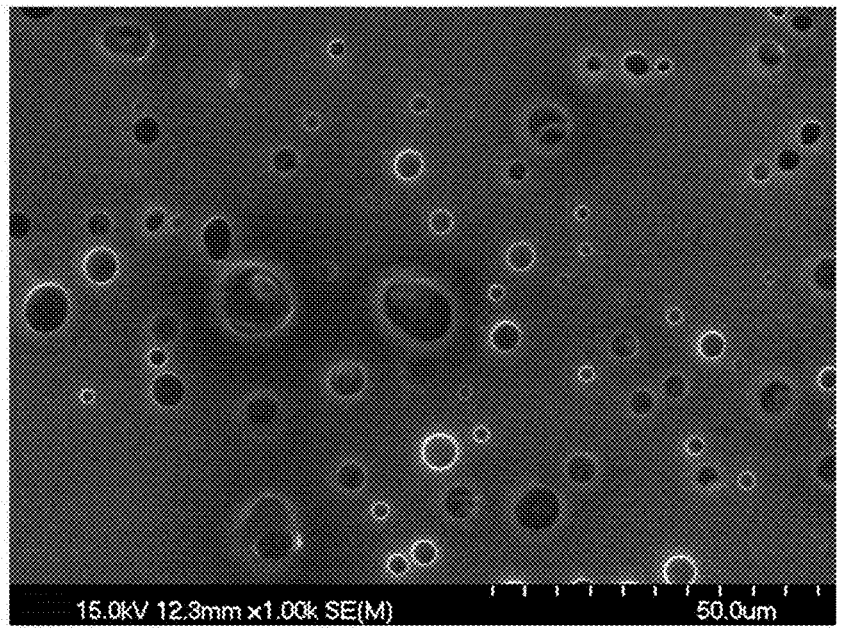
FIGS. 7 and 8 are photographs showing outer surfaces of light emitting diodes according to Comparative Example 1 and Example 1 after operation for 150 hours.
Figure 8:
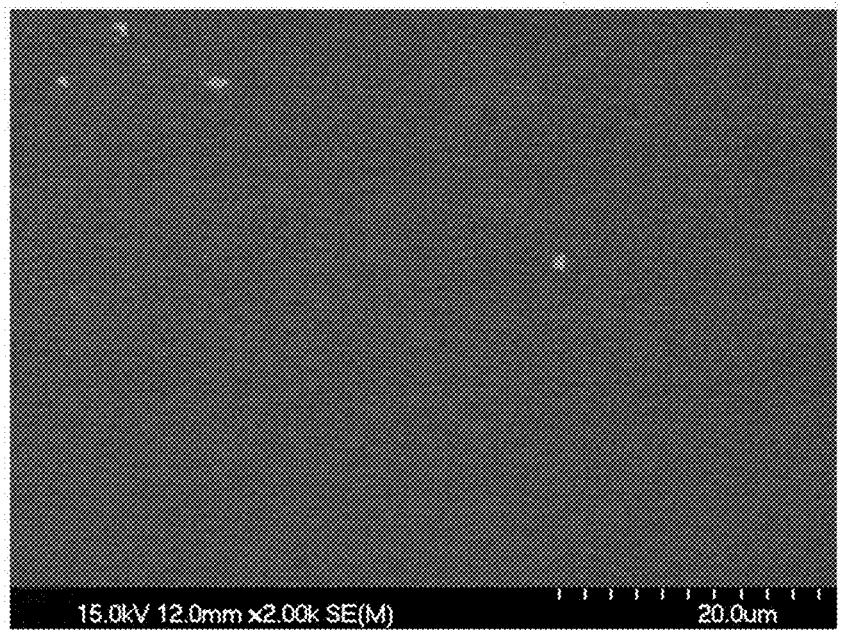

Photographs showing outer surfaces of light emitting diodes according to Comparative Example 1 and Example 1 after operation for 150 hours are shown FIGS. 7 and 8, respectively. FIG. 7 shows serious damage to a QD-silicone resin but FIG. 8 shows that the integrity a polymer film is maintained well.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| Description of symbols | |
|---|---|
| 104: substrate | 103: light emitting diode chip |
| 110: light emitting particle | 112: matrix polymer |
| 115: organic/inorganic hybrid polymer layer | 116: polymer film |
| | 112b: second matrix polymer |
| 112a: first matrix polymer | |
| 114: transparent plate | |

What is claimed is:

1. An optoelectronic device, comprising:
a light source; an emission layer disposed on the light source comprising a light emitting particle dispersed in a first matrix polymer; a first polymer film consisting of an organic/inorganic hybrid polymer disposed directly on the emission layer; and a second polymer film disposed directly on the first polymer film, wherein the light emitting particle is a semiconductor nanocrystal selected from a Group II-VI compound, a Group III-V compound, a Group IV-VI compound, a Group IV element, a Group IV compound, or a combination thereof, the organic/inorganic hybrid polymer comprises a first moiety comprising a siloxane bond (—Si—O—Si—), a second moiety comprising a siloxane bond and at least one functional group, and a third moiety comprising a siloxane bond and a cross-linked structure of at least one reactive functional group, and the organic/inorganic hybrid polymer is different from the matrix polymer, and the second polymer film consists of a polymerized product of a first monomer with at least two thiol (—SH) groups and a second monomer with at least two carbon-carbon unsaturated bond-containing groups at a terminal end.

2. The optoelectronic device of claim 1, wherein the first monomer comprising at least two thiol (—SH) groups, is represented by the following Chemical Formula 1:

Chemical Formula 1 wherein, in Chemical Formula 1, $R^1$ is hydrogen, a substituted or unsubstituted linear or branched C1 to C30 alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a substituted or unsubstituted C2 to C30 alkenyl group, a substituted or unsubstituted C2 to C30 alkynyl group, a substituted or unsubstituted C3 to C30 alicyclic organic group comprising a double bond or triple bond in a ring, a substituted or unsubstituted C3 to C30 heterocycloalkyl group comprising a double bond or triple bond in a ring, a C3 to C30 alicyclic group substituted with a C2 to C30 alkenyl group or a C2 to C30 alkynyl group, a C3 to C30 heterocycloalkyl group substituted with a C2 to C30 alkenyl group or a C2 to C30 alkynyl group, a hydroxyl group, —NH₂, a substituted or unsubstituted C1 to C60 amine group (—NRR', wherein R and R' are each independently a linear or branched C1 to C30 alkyl group),an isocyanurate group, a (meth)acrylate group, a halogen, —ROR' (wherein R is a substituted or unsubstituted C1 to C20 alkylene group and R' is hydrogen or a linear or branched C1 to C20 alkyl group), —C(=O)OR' (wherein R' is hydrogen or a linear or branched C1 to C20 alkyl group), —CN, or —C(=O)ONRR' (wherein R and R' are each independently hydrogen or a linear or branched C1 to C20 alkyl group);

$L_1$ is a single bond, a substituted or unsubstituted C1 to C30 alkylene group, a substituted or unsubstituted C6 to C30 arylene group, a substituted or unsubstituted C6 to C30 heteroarylene group, a substituted or unsubstituted C3 to C30 cycloalkylene group, or a substituted or unsubstituted C3 to C30 heterocycloalkylene group;

$Y_1$ is a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene group is replaced by a sulfonyl group (—S(=O)₂—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a linear or branched C1 to C10 alkyl group), —NR— (wherein R is hydrogen or a linear or branched C1 to C10 alkyl group), or a combination thereof;

m is integer of 1 or more;

k1 is an integer of 0 or 1 or more;

k2 is an integer of 1 or more; and the sum of m and k2 is an integer of 3 or more; provided that m does not exceed the valence of $Y_1$; and provided that the sum of k1 and k2 does not exceed the valence of $L_1$.

3. The optoelectronic device of claim 1, wherein the second monomer is represented by the following Chemical Formula 2:

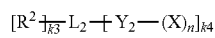

Chemical Formula 2 wherein, in Chemical Formula 2,

X is a C2 to C30 aliphatic organic group comprising a carbon-carbon unsaturated bond, a C6 to C30 aromatic group comprising a carbon-carbon double bond or a carbon-carbon triple bond or a C3 to C30 alicyclic organic group comprising a carbon-carbon double bond or a carbon-carbon triple bond,;

$R^2$ is hydrogen, a substituted or unsubstituted linear or branched C1 to C30 alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a substituted or unsubstituted C2 to C30 alkenyl group, a substituted or unsubstituted C2 to C30 alkynyl group, a substituted or unsubstituted C3 to C30 alicyclic organic group comprising a double bond or triple bond in a ring, a substituted or unsubstituted C3 to C30 heterocycloalkyl group comprising a double bond or triple bond in a ring, a C3 to C30 alicyclic organic group substituted with a C2 to C30 alkenyl group or a C2 to C30 alkynyl group, a C3 to C30 heterocycloalkyl group substituted with a C2 to C30 alkenyl group or a C2 to C30 alkynyl group, a hydroxyl group; —$NH_2$, a substituted or unsubstituted C1 to C60 amine group (—NRR', wherein R and R' are each independently a linear or branched C1 to C30 alkyl group), an isocyanate group, an isocyanurate group, a (meth)acryloyloxy group, a halogen, —ROR' (wherein R is a substituted or unsubstituted C1 to C20 alkylene group and R' is hydrogen or a linear or branched C1 to C20 alkyl group), an acyl halide group (—RC(=O)X, wherein R is a substituted or unsubstituted alkylene group and X is a halogen) —C(=O)OR' (wherein R' is hydrogen or a linear or branched C1 to C20 alkyl group), —CN, or —C(=O)ONRR' (wherein R and R' are each independently hydrogen or a linear or branched C1 to C20 alkyl group);

$L_2$ is a single bond, a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group;

$Y_2$ is a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) wherein R is hydrogen or a linear or branched C1 to C10 alkyl group, —NR— wherein R is hydrogen or a linear or branched C1 to C10 alkyl group, or a combination thereof;

n is an integer of 1 or more;

k3 is an integer of 0 or 1 or more;

k4 is an integer of 1 or more; and the sum of n and k4 is an integer of 3 or more; provided that n does not exceed the valence of $Y_2$; and provided that the sum of k3 and k4 does not exceed the valence of $L_2$.

4. The optoelectronic device of claim 2, wherein the first monomer of the above Chemical Formula 1 comprises a monomer of the following Chemical Formula 1-1:

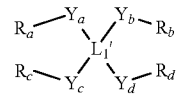

Chemical Formula 1-1 wherein, in Chemical Formula 1-1, $L_1'$ is a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group; and $Y_a$ to $Y_d$ are each independently substituted or unsubstituted C1 to C30 alkylene group, a substituted or unsubstituted C2 to C30 alkenylene group, or a C1 to C30 alkylene group or a C2 to C30 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a linear or branched C1 to C10 alkyl group), or —NR— (wherein R is hydrogen or a linear or branched C1 to C10 alkyl group); and $R_a$ to $R_d$ are each a thiol group (SH); or one or more of the groups —$R_a$—$Y_a$—, —$R_b$—$Y_b$—, $R_c$—$Y_c$—, and $R_d$—$Y_d$— are $R_1$ of Chemical Formula 1, provided that at least two of $Y_a$ to $Y_d$ are as defined above and at least two of $R_a$ to $R_d$ are a thiol group (—SH).

5. The optoelectronic device of claim 3, wherein in Chemical Formula 2, X is an acryloxy group, a methacryloxy group, a substituted or unsubstituted C2 to C30 alkenyl group, a substituted or unsubstituted C2 to C30 alkynyl group, a substituted or unsubstituted C3 to C30 alicyclic organic group comprising a double bond or triple bond in a ring, a substituted or unsubstituted C3 to C30 heterocycloalkyl group comprising a double bond or triple bond in a ring, a C3 to C30 alicyclic organic group substituted with a C2 to C30 alkenyl group or a C2 to C30 alkynyl group, or a C3 to C30 heterocycloalkyl group substituted with a C2 to C30 alkenyl group or a C2 to C30 alkynyl group.

6. The optoelectronic device of claim 3, wherein the substituted or unsubstituted C3 to C30 alicyclic organic group including a double bond or triple bond in a ring is a norbornene group, a maleimide group, a nadimide group, a tetrahydrophthalimide group, or a combination thereof.

7. The optoelectronic device of claim 3, wherein in Chemical Formula 2, $L_2$ is a substituted or unsubstituted pyrrolidinyl group, a substituted or unsubstituted tetrahydrofuranyl group, a substituted or unsubstituted pyridyl group, a substituted or unsubstituted pyrimidyl group, a substituted or unsubstituted piperidyl group, a substituted or unsubstituted triazinyl group, a substituted or unsubstituted trioxotriazinyl group, or a substituted or unsubstituted isocyanurate group.

8. The optoelectronic device of claim 1, wherein the second monomer comprises the compounds represented by the following Chemical Formulae 2-1 and 2-2:

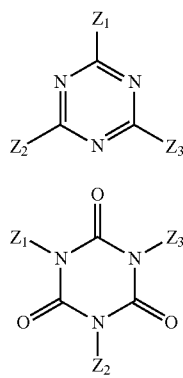

Chemcial Formula 2-1

Chemical Formula 2-2 wherein, in Chemical Formulae 2-1 and 2-2, $Z_1$ to $Z_3$ are each independently *—$Y_2$—$X_n$ wherein X is a C2 to C30 aliphatic organic group comprising a carbon-carbon unsaturated bond, a C6 to C30 aromatic group comprising a carbon-carbon double bond or a carbon-carbon triple bond or a C3 to C30 alicyclic organic group comprising a carbon-carbon double bond or a carbon-carbon triple bond: $Y_2$ is a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) wherein R is hydrogen or a linear or branched C1 to C10 alkyl group, —NR— wherein R is hydrogen or a linear or branched C1 to C10 alkyl group, or a combination thereof; n is an integer of 1 or more; and wherein * represents the point of attachment.

9. The optoelectronic device of claim 1, wherein the first monomer and the second monomer are used so that thiol groups of the first monomer and unsaturated carbon-carbon bonds of the second monomer are present at a mole ratio of about 1:0.75 to about 1:1.25.

10. An optoelectronic device, comprising: a light source; an emission layer disposed on the light source comprising a light emitting particle dispersed in a matrix polymer; a first polymer film consisting of an organic/inorganic hybrid polymer disposed directly on the emission layer; and a second polymer film disposed directly on the first polymer film, wherein the light emitting particle is a semiconductor nanocrystal selected from a Group II-VI compound, a Group III-V compound, a Group IV-VI compound, a Group IV element, a Group IV compound, or a combination thereof, the organic/inorganic hybrid polymer comprises a first moiety comprising a siloxane bond (—Si—O—Si—) a second moiety comprising a siloxane bond and at least one functional group, and a third moiety comprising a siloxane bond and a cross-linked structure of at least one reactive functional groups, and the organic/inorganic hybrid polymer is different from the matrix polymer, and the second polymer film consists of a polymerized product of a first monomer comprising with at least two thiol (—SH) groups, a second monomer comprising with at least two carbon-carbon unsaturated bond-containing groups at a terminal end, and at least one of a third monomer comprisin one thiol group located at a terminal end of the third monomer, a fourth monomer comprising one unsaturated carbon-carbon bond located at a terminal end of the fourth monomer, or a combination thereof.

11. The optoelectronic device of claim 1, wherein the organic/inorganic hybrid polymer further comprises a fourth moiety comprising a —O-M-O— bond (wherein, M is Al, Sn, Ti, Zr, Ge, B, or a combination thereof).

12. The optoelectronic device of claim 1, wherein the organic/inorganic hybrid polymer is a condensation polymerization polymer of a first alkoxy silane represented by the following Chemical Formula 3, a second alkoxy silane represented by the following Chemical Formula 4, and a third alkoxy silane represented by the following Chemical Formula 5:

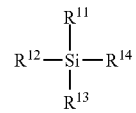

Chemical Formula 3 wherein, in Chemical Formula 3,
$R^{11}$ to $R^{14}$ are each independently a hydroxyl group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group;

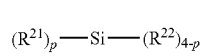

Chemical Formula 4 wherein, in Chemical Formula 4,
$R^{21}$ is a substituted or unsubstituted C6 to C20 aryl group, a substituted or unsubstituted C1 to C20 linear or branched alkyl group, a substituted or unsubstituted C1 to C20 aminoalkyl group, a substituted or unsubstituted C2 to C20 alkynyl group, C2 to C20 alkenyl group, a substituted or unsubstituted C1 to C20 amine group, —C(=O)OR' (wherein R' is a C1 to C20 linear or branched alkyl group) or —C(=O)ONRR' (wherein R and R' are each independently a C1 to C20 linear or branched alkyl group);
$R^{22}$ is a hydroxyl group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group; and p is an integer ranging from 1 to 3; and Chemical Formula 5

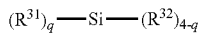

wherein, in Chemical Formula 5, $R^{31}$ is a reactive photo-cross-linking or a thermal cross-linking functional group selected from a (meth)acryloxy group, an epoxy group, a substituted or unsubstituted C2 to C30 alkenyl group, a substituted or unsubstituted C2 to C30 alkynyl group, a spiroorthoester group, a substituted or unsubstituted C3 to C30 alicyclic organic group comprising a double bond or triple bond in a ring, a substituted or unsubstituted C3 to C30 heterocycloalkyl group comprising a double bond or triple bond in a ring, a C3 to C30 alicyclic organic group substituted with a C2 to C30 alkenyl group or a C2 to C30 alkynyl group, and a C3 to C30 heterocycloalkyl group substituted with a C2 to C30 alkenyl group or a C2 to C30 alkynyl group;

$R^{32}$ is a hydroxyl group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group; and q is an integer ranging from 1 to 3.

13. The optoelectronic device of claim 1, wherein the light emitting particle further comprises a coating comprising a polymer comprising a carboxyl group or a salt thereof.

14. The optoelectronic device of claim 1, wherein the optoelectronic device further comprises a substrate having a recessed portion and the light source is disposed on the recessed portion of the substrate and is filled with a second matrix polymer consisting of a silicone resin, and wherein a transparent plate is disposed on the second matrix polymer and the emission layer is disposed directly on the transparent plate so that the transparent plate is present between the light source and the emission layer.

15. A stacking structure comprising:
a composite layer comprising a matrix polymer and a light emitting particle dispersed in the first matrix polymer; a first polymer film consisting of an organic/inorganic hybrid polymer disposed directly on the composite layer; and
a second polymer film disposed directly on the first polymer film,
wherein the light emitting particle is a semiconductor nanocrystal selected from a Group II-VI compound, a Group III-V compound, a Group IV-VI compound, a Group IV element, a Group IV compound, or a combination thereof,
the organic/inorganic hybrid polymer comprises a first moiety comprising a siloxane bond (—Si—O—Si—), a second moiety comprising a siloxane bond and at least one functional group, and a third moiety comprising a siloxane bond and a cross-linked structure of at least one reactive functional groups, and the organic/inorganic hybrid polymer is different from the matrix polymer, and the second polymer film consists of a polymerized product of a first monomer with at least two thiol (—SH) groups and a second monomer with at least two carbon-carbon unsaturated bond-containing groups at a terminal end.

16. The stacking structure of claim 15, wherein the first monomer comprising at least two thiol (—SH) groups is represented by the following Chemical Formula 1:

Chemical Formula 1

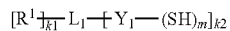

wherein, in Chemical Formula 1, $R^1$ is hydrogen, a substituted or unsubstituted linear or branched C1 to C30 alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a substituted or unsubstituted C2 to C30 alkenyl group, a substituted or unsubstituted C2 to C30 alkynyl group, a substituted or unsubstituted C3 to C30 alicyclic organic group comprising a double bond or triple bond in a ring, a substituted or unsubstituted C3 to C30 heterocycloalkyl group comprising a double bond or triple bond in a ring, a C3 to C30 alicyclic organic group substituted with a C2 to C30 alkenyl group or a C2 to C30 alkynyl group, a C3 to C30 heterocycloalkyl group substituted with a C2 to C30 alkenyl group or a C2 to C30 alkynyl group, a hydroxyl group, —NH$_2$, a substituted or unsubstituted C1 to C60 amine group (—NRR', wherein R and R' are each independently a linear or branched C1 to C30 alkyl group), an isocyanurate group, a (meth)acrylate group, a halogen, —ROR' (wherein R is a substituted or unsubstituted C1 to C20 alkylene group and R' is hydrogen or a linear or branched C1 to C20 alkyl group), —C(=O)OR' (wherein R' is hydrogen or a linear or branched C1 to C20 alkyl group) —CN, or —C(=O)ONRR' (wherein R and R' are each independently hydrogen or a linear or branched C1 to C20 alkyl group);

$L_1$ is a single bond, a substituted or unsubstituted C1 to C30 alkylene group, a substituted or unsubstituted C6 to C30 arylene group, a substituted or unsubstituted C6 to C30 heteroarylene group, a substituted or unsubstituted C3 to C30 cycloalkylene, or a substituted or unsubstituted C3 to C30 heterocycloalkylene;

$Y_1$ is a single bond, a substituted or unsubstituted C1 to C30 or C1 to C10 alkylene group; a substituted or unsubstituted C2 to C30 or C2 to C10 alkenylene group, or a C1 to C30 or C1 to C10 alkylene group or a C2 to C30 or C2 to C10 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 linear or branched alkyl group), —NR— (wherein R is hydrogen or a C1 to C10 linear or branched alkyl group), or a combination thereof;

m is an integer of 1 or more;

k1 is an integer of 0 or 1 or more;

k2 is an integer of 1 or more; and the sum of m and k2 is an integer of 3 or more; provided that m does not exceed the valence of $Y_1$; and provided that the sum of k1 and k2 does not exceed the valence of $L_1$.

17. The stacking structure of claim 15, wherein the second monomer is represented by the following Chemical Formula 2:

Chemical Formula 2

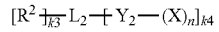

wherein, in Chemical Formula 2,

X is a C2 to C30 aliphatic organic group comprising a carbon-carbon unsaturated bond, a C6 to C30 aryl group comprising a carbon-carbon double bond or a carbon-carbon triple bond or a C3 to C30 alicyclic organic group comprising a carbon-carbon double bond or a carbon-carbon triple bond;

$R^2$ is hydrogen, a substituted or unsubstituted linear or branched C1 to C30 alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a substituted or unsubstituted C2 to C30 alkenyl group, a substituted or unsubstituted C2 to C30 alkynyl group, a substituted or unsubstituted C3 to C30 alicyclic organic group comprising a double bond or triple bond in a ring, a substituted or unsubstituted C3 to C30 heterocycloalkyl group comprising a double bond or triple bond in a ring, a C3 to C30 alicyclic organic group substituted with a C2 to C30 alkenyl group or a C2 to C30 alkynyl group, a C3 to C30 heterocycloalkyl group substituted with a C2 to C30 alkenyl group or a C2 to C30 alkynyl group, a hydroxyl group, —NH$_2$, a substituted or unsubstituted C1 to C60 amine group (—NRR', wherein R and R' are each independently a linear or branched C1 to C30 alkyl group,)an isocyanate group, an isocyanurate group, (meth)acryloyloxy group, a halogen, —ROR' (wherein R is a substituted or unsubstituted C1 to C20 alkylene group and R' is hydrogen or a linear or branched C1 to C20 alkyl group), an acyl halide group (—RC(=O)X, wherein R is a substituted or unsubstituted alkylene group and X is a halogen) —C(=O)OR' (wherein R' is hydrogen or a linear or branched C1 to C20 alkyl group) —CN, or —C(=O)ONRR' (wherein R and R' are each independently hydrogen or a linear or branched C1 to C20 alkyl group);

$L_2$ is a single bond, a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group;

$Y_2$ is each independently a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) wherein R is hydrogen or a linear or branched C1 to C10 alkyl group, —NR— wherein R is hydrogen or a linear or branched C1 to C10 alkyl group, or a combination thereof;

n is an integer of 1 or more, k3 is an integer of 0 or 1 or more;

k4 is an integer of 1 or more; and the sum of n and k4 is an integer of 3 or more; provided that n does not exceed the valence of $Y_2$; and provided that the sum of k3 and k4 does not exceed the valence of $L_2$.

18. The stacking structure of claim 15, wherein the organic/inorganic hybrid polymer further comprises a fourth moiety comprising a —O-M-O— bond (wherein, M is Al, Sn, Ti, Zr, Ge, B, or a combination thereof).

19. The stacking structure of claim 15, wherein the organic/inorganic hybrid polymer is a condensation polymerization polymer of a first alkoxy silane represented by the following Chemical Formula 3, a second alkoxy silane represented by the following Chemical Formula 4, and a third alkoxy silane represented by the following Chemical Formula 5:

Chemical Formula 3

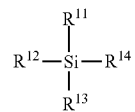

wherein, in Chemical Formula, $R^{11}$ to $R^{14}$ are each independently a hydroxyl group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group;

Chemical Formula 4

wherein, in Chemical Formula 4, $R^{21}$ is a substituted or unsubstituted C6 to C20 aryl group, a substituted or unsubstituted C1 to C20 linear or branched alkyl group, a substituted or unsubstituted C1 to C20 aminoalkyl group, a substituted or unsubstituted C2 to C20 alkynyl group, C2 to C20 alkenyl group, a substituted or unsubstituted C1 to C20 amine group, —C(=O)OR' (wherein R' is a C1 to C20 linear or branched alkyl group) or —C(=O)ONRR' (wherein R and R' are each independently a C1 to C20 linear or branched alkyl group);

$R^{22}$ is a hydroxyl group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group; and p is an integer ranging from 1 to 3; and Chemical Formula 5

wherein, in Chemical Formula 5, $R^{31}$ is a reactive photo-cross-linking or a thermal cross-linking functional group selected from a (meth)acryloxy group; an epoxy group; a substituted or unsubstituted C2 to C30 alkenyl group, a substituted or unsubstituted C2 to C30 alkynyl group, a spiroorthoester group, a substituted or unsubstituted C3 to C30 alicyclic organic group comprising a double bond or triple bond in a ring, a substituted or unsubstituted C3 to C30 heterocycloalkyl group comprising a double bond or triple bond in a ring, a C3 to C30 alicyclic organic group substituted with a C2 to C30 alkenyl group or a C2 to C30 alkynyl group, and a C3 to C30 heterocycloalkyl group substituted with a C2 to C30 alkenyl group or a C2 to C30 alkynyl group;

$R^{32}$ is a hydroxyl group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group; and q is an integer ranging from 1 to 3.

20. The stacking structure of claim 15, wherein the light emitting particle further comprises a coating comprising a polymer comprising a carboxyl group or a salt thereof.

21. The stacking structure of claim 15, wherein the structure further comprises a substrate having a recessed portion and the light source is disposed on the recessed portion of the substrate and is filled with a second matrix polymer consisting of a silicone resin, and wherein a transparent plate is disposed on the second matrix polymer and the emission layer is disposed directly on the transparent plate so that the transparent plate is present between the light source and the emission layer.

* * * * *